(12) United States Patent
Tsai et al.

(10) Patent No.: US 10,777,663 B2
(45) Date of Patent: Sep. 15, 2020

(54) SEMICONDUCTOR DEVICE HAVING BORON-DOPED GERMANIUM TIN EPITAXY STRUCTURE AND METHOD FOR FORMING THE SAME

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Chung-En Tsai, Hsinchu County (TW); Fang-Liang Lu, New Taipei (TW); Pin-Shiang Chen, Taipei (TW); Chee-Wee Liu, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 16/150,182

(22) Filed: Oct. 2, 2018

(65) Prior Publication Data
US 2019/0165141 A1 May 30, 2019

Related U.S. Application Data

(60) Provisional application No. 62/593,121, filed on Nov. 30, 2017.

(51) Int. Cl.
*H01L 29/66* (2006.01)
*H01L 29/167* (2006.01)
(Continued)

(52) U.S. Cl.
CPC ...... *H01L 29/66795* (2013.01); *H01L 21/223* (2013.01); *H01L 21/3065* (2013.01); *H01L 29/167* (2013.01); *H01L 29/456* (2013.01); *H01L 29/6656* (2013.01); *H01L 29/66545* (2013.01); *H01L 29/66636* (2013.01); *H01L 29/7848* (2013.01); *H01L 29/7851* (2013.01); *H01L 21/0245* (2013.01); *H01L 21/0262* (2013.01); *H01L 21/02452* (2013.01);
(Continued)

(58) Field of Classification Search
CPC ............ H01L 29/66795; H01L 21/223
See application file for complete search history.

(56) References Cited

U.S. PATENT DOCUMENTS 9,799,570 B1 * 10/2017 Cheng .............. H01L 21/82387
2013/0264639 A1 * 10/2013 Glass ................ H01L 29/7785
257/335

(Continued)

OTHER PUBLICATIONS

Joe Margetis et al., "Growth and Characterization of Epitaxial Ge1-x Snx Alloys and Heterostructures Using a Commercial CVD System", ECS Transactions 64 (6) 711-720 (Oct. 9, 2014).
(Continued)

*Primary Examiner* — Lex H Malsawma
*Assistant Examiner* — Xia L Cross
(74) *Attorney, Agent, or Firm* — Maschoff Brennan

(57) ABSTRACT

A method includes forming a fin structure over a substrate; forming a source/drain structure adjoining the fin structure, in which the source/drain structure includes tin; and exposing the source/drain structure to a boron-containing gas to diffuse boron into the source/drain structure to form a doped region in the source/drain structure.

20 Claims, 36 Drawing Sheets

(51) Int. Cl.
*H01L 21/223* (2006.01)
*H01L 21/3065* (2006.01)
*H01L 29/78* (2006.01)
*H01L 29/45* (2006.01)
*H01L 21/3105* (2006.01)
*H01L 21/02* (2006.01)
*H01L 29/165* (2006.01)
*H01L 29/08* (2006.01)

(52) U.S. Cl.
CPC .. *H01L 21/02532* (2013.01); *H01L 21/02535* (2013.01); *H01L 21/31053* (2013.01); *H01L 29/0847* (2013.01); *H01L 29/165* (2013.01)

(56) References Cited

U.S. PATENT DOCUMENTS

2015/0097239 A1* 4/2015 Chen .................. H01L 23/3171
257/347
2016/0093726 A1* 3/2016 Ching .................. H01L 29/785
257/192
2019/0097050 A1* 3/2019 Ebrish .................. H01L 29/267

OTHER PUBLICATIONS

B. Vincent et al., "Undoped and in-situ B doped GeSn epitaxial growth on Ge by atmospheric pressure-chemical vapor deposition", Applied Physics Letters 99, 152103 (Oct. 11, 2011).

B. Vincent et al., "Characterization of GeSn materials for future Ge pMOSFETs source/drain stressors", Microelectronic Engineering 88 (Apr. 1, 2011) 342-346.

Chung-En Tsai et al., "Boron-doping induced Sn loss in GeSn alloys grown by chemical vapor deposition", Thin Solid Films 660 (Jun. 30, 2018) 263-266.

* cited by examiner

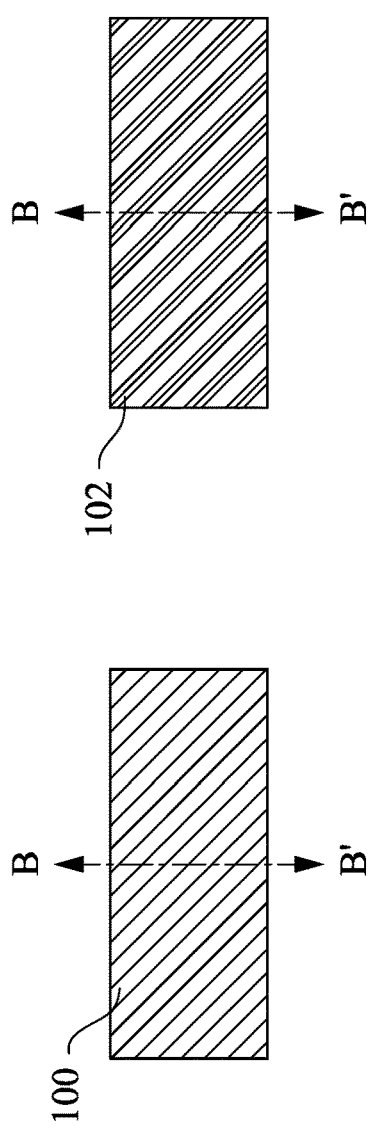
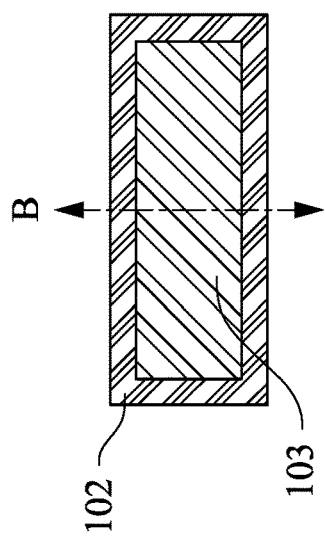
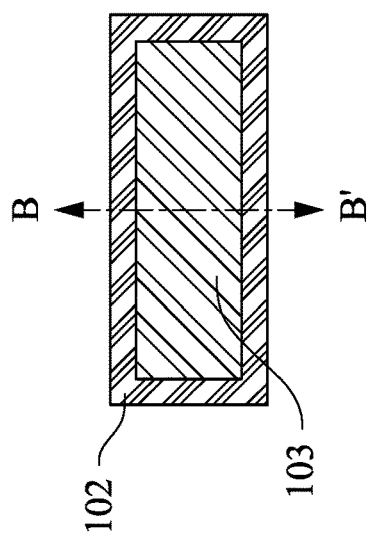
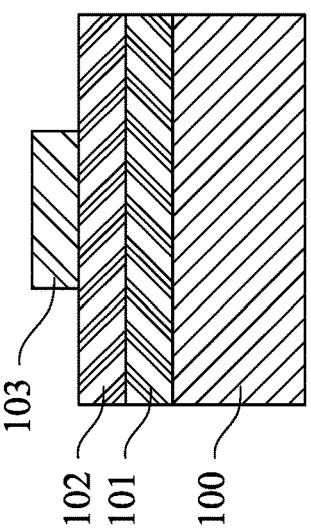
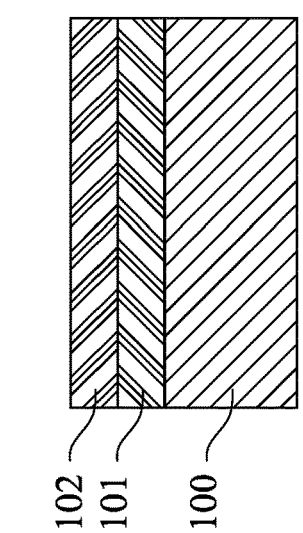
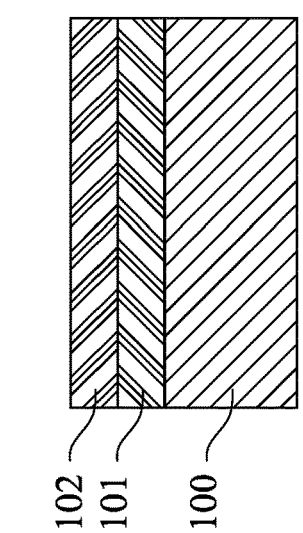
Fig. 1A  Fig. 2A  Fig. 3A
Fig. 1B  Fig. 2B  Fig. 3B

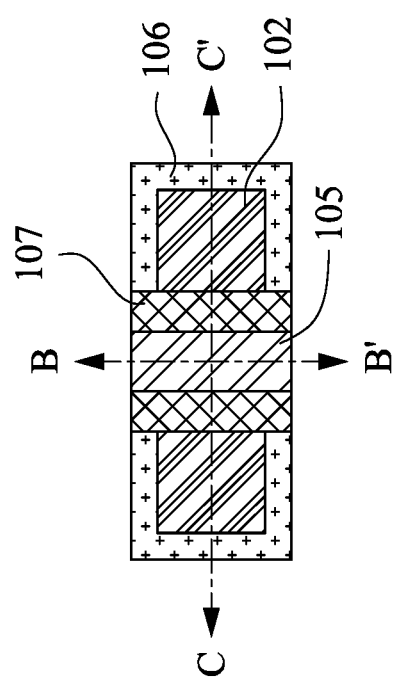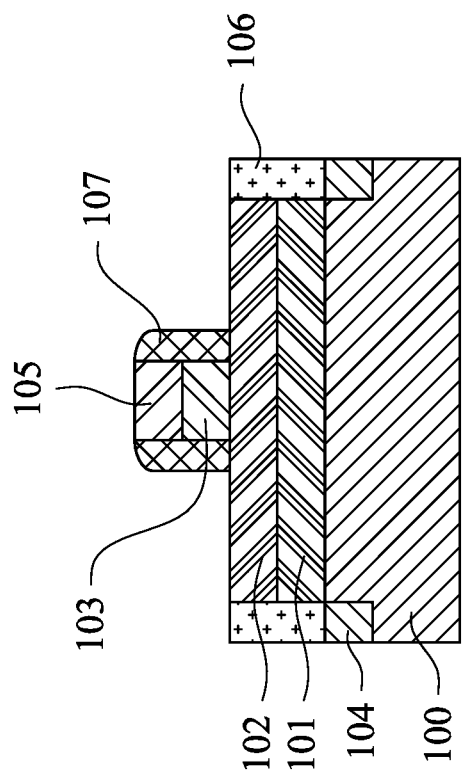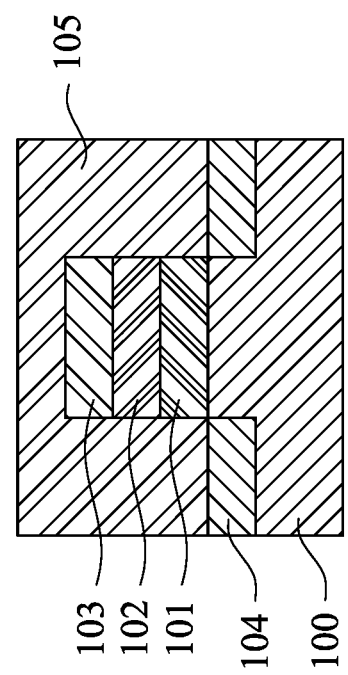
Fig. 10A
Fig. 10B
Fig. 10C

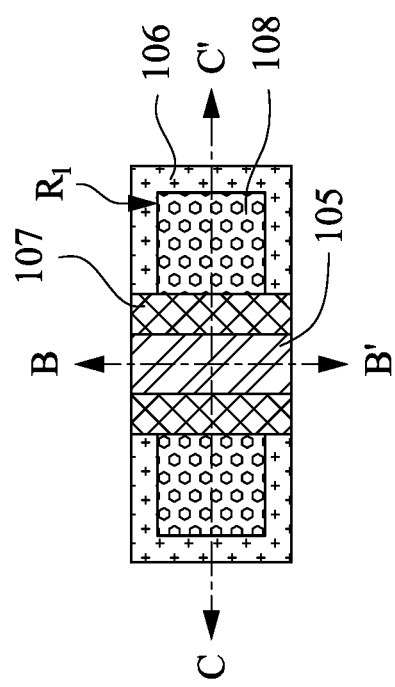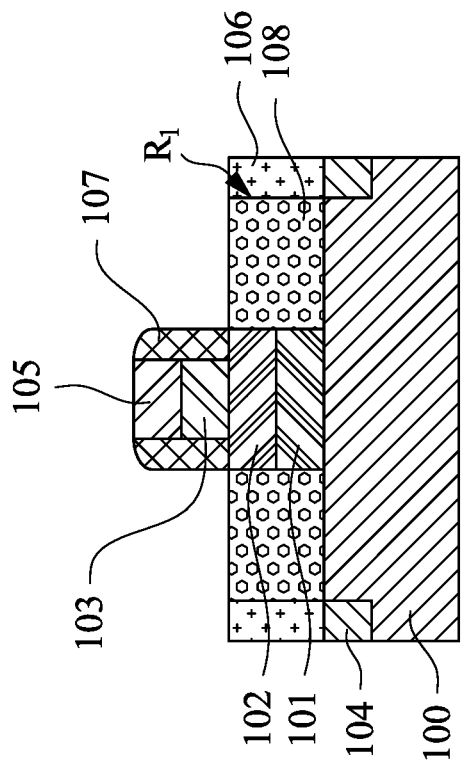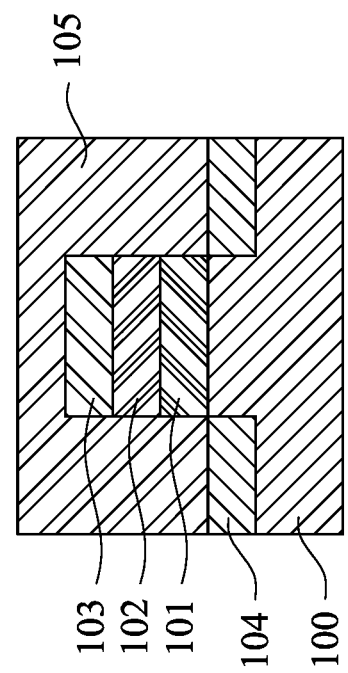
Fig. 11A
Fig. 11B
Fig. 11C

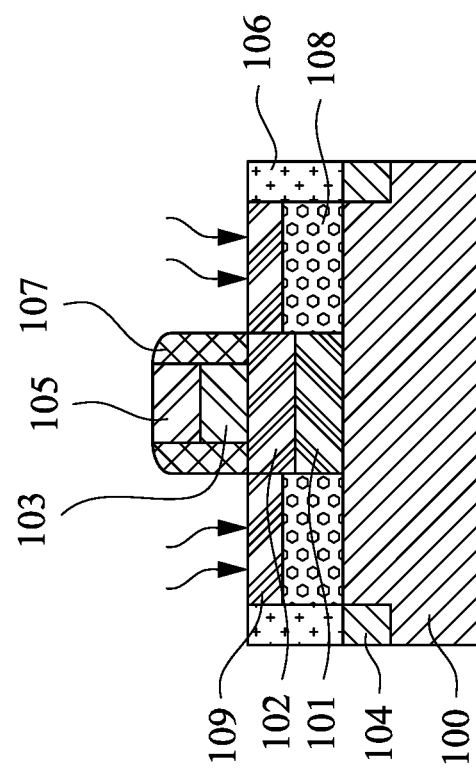
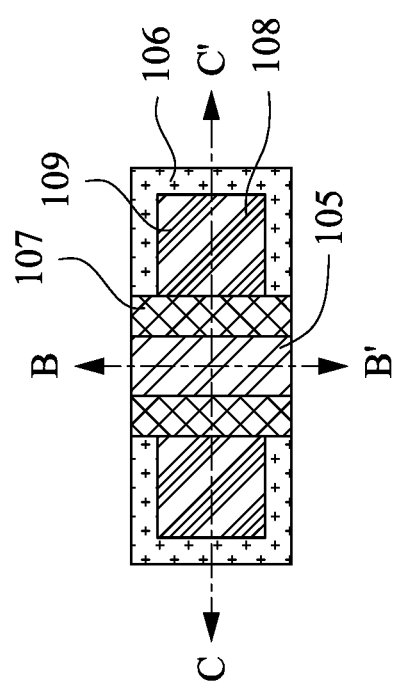
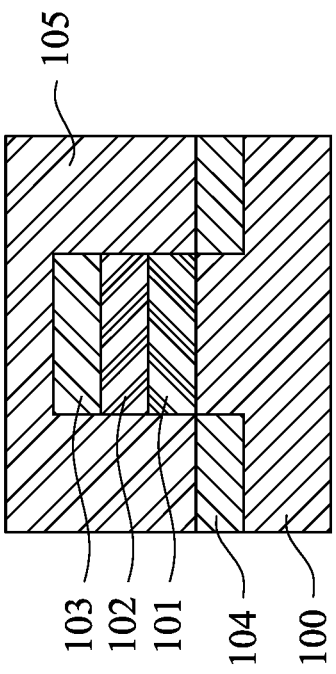

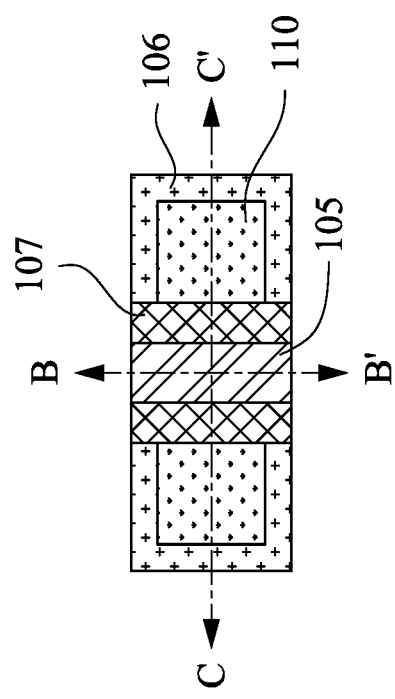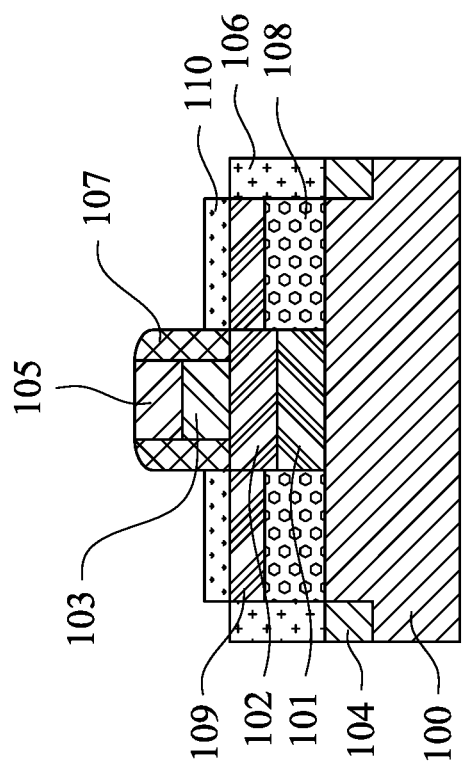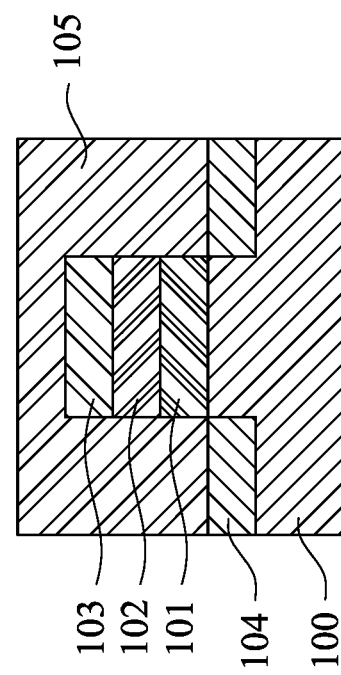
Fig. 13A
Fig. 13B
Fig. 13C

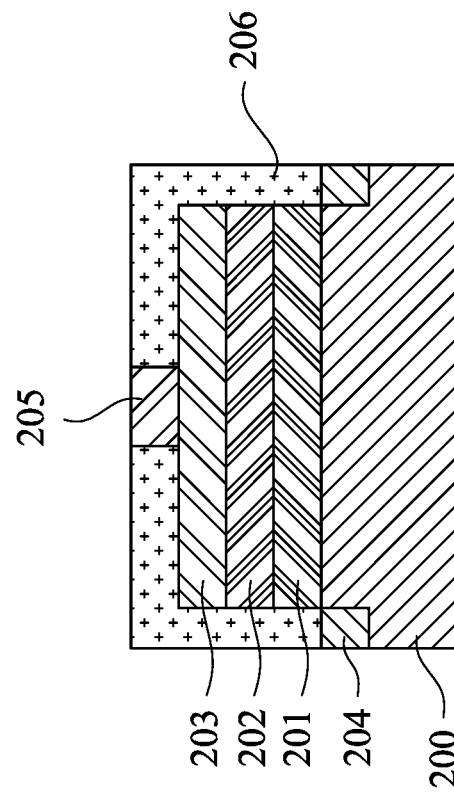
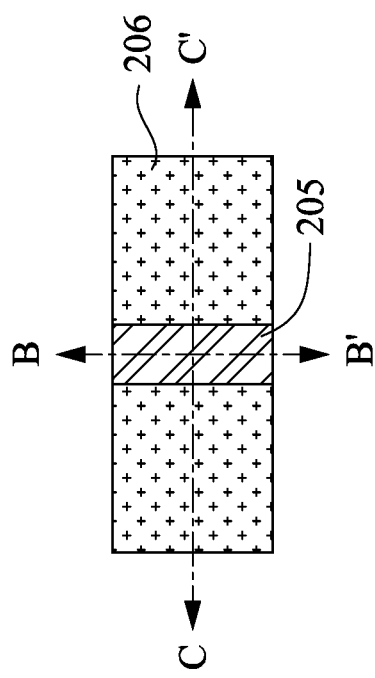
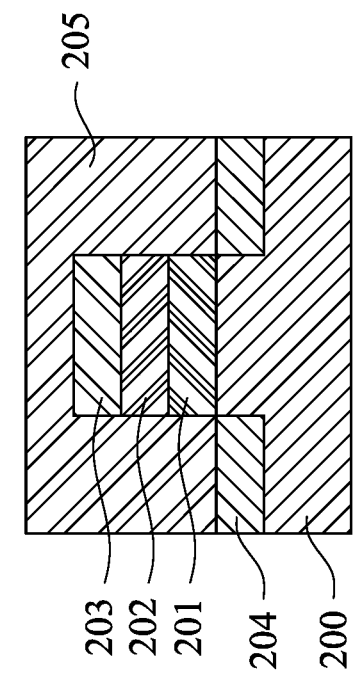
Fig. 26A
Fig. 26B
Fig. 26C

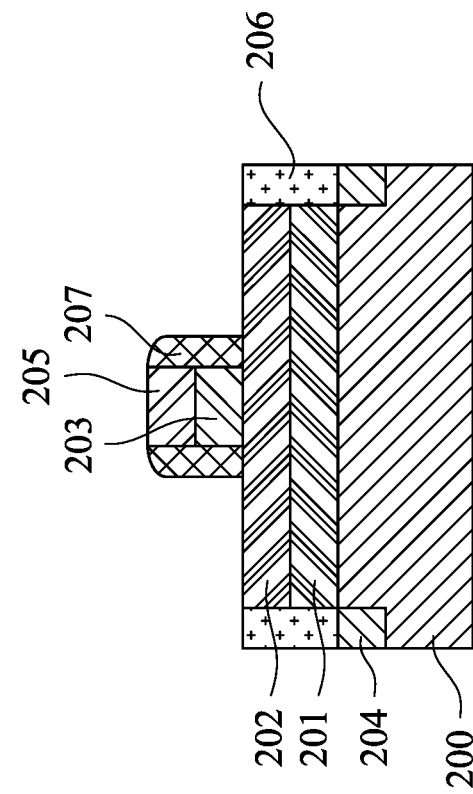
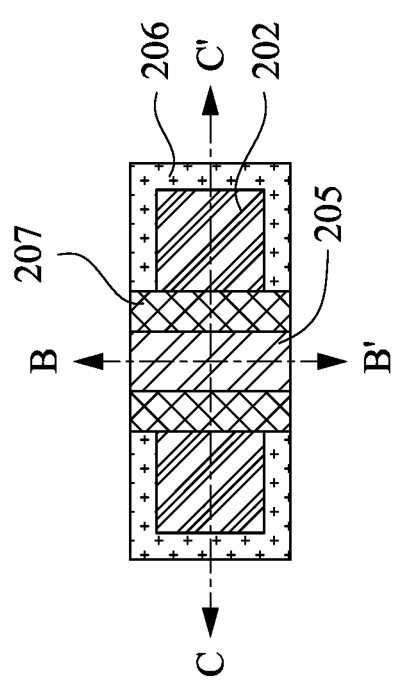
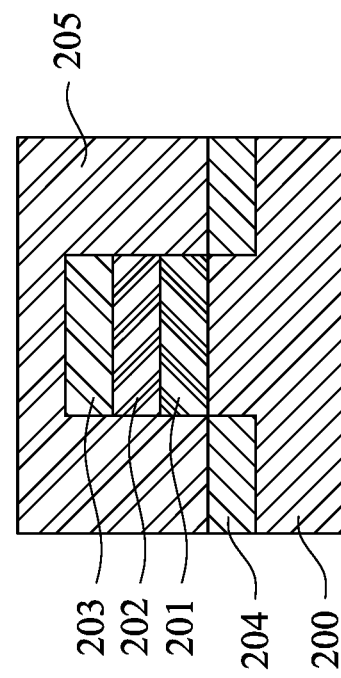

US 10,777,663 B2

SEMICONDUCTOR DEVICE HAVING BORON-DOPED GERMANIUM TIN EPITAXY STRUCTURE AND METHOD FOR FORMING THE SAME

PRIORITY CLAIM AND CROSS-REFERENCE

This application claims priority to U.S. Provisional Application Ser. No. 62/593,121, filed Nov. 30, 2017, which is herein incorporated by reference.

BACKGROUND

The semiconductor integrated circuit (IC) industry has experienced rapid growth. In the course of IC evolution, functional density (i.e., the number of interconnected devices per chip area) has increased while geometry size (i.e., the smallest component (or line) that can be created using a fabrication process) has decreased. This scaling down process increases production efficiency and lowers associated costs.

Such scaling down has also increased the complexity of processing and manufacturing ICs and, for these advances to be realized, similar developments in IC processing and manufacturing are desired. For example, a three dimensional transistor, such as a fin-like field-effect transistor (FinFET), has been introduced to replace a planar transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 18C illustrate a method of manufacturing a semiconductor device at various stages in accordance with some embodiments.

FIGS. 20A to 41C illustrate a method of manufacturing a semiconductor device at various stages in accordance with some embodiments.

DETAILED DESCRIPTION

Figure 4A:
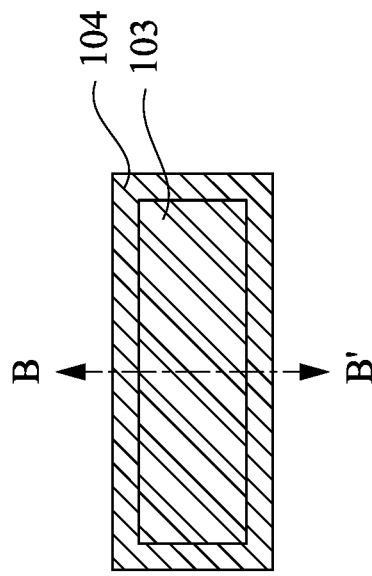

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 18C illustrate a method of manufacturing a semiconductor device at various stages in accordance with some embodiments.

Reference is made to FIGS. 1A and 1B, in which FIG. 1A is a top view of one stage of manufacturing a semiconductor device, and FIG. 1B is a cross-sectional view along line B-B' of FIG. 1A. A substrate 100 is provided. The substrate 100 may be a bulk silicon substrate. Alternatively, the substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), indium antimonide (InSb), Sn, SiGeSn; or combinations thereof. Possible substrates 100 also include a silicon-on-insulator (SOI) substrate. SOI substrates are fabricated using separation by implantation of oxygen (SIMOX), wafer bonding, and/or other suitable methods.

The substrate 100 may also include various doped regions. The doped regions may be doped with p-type dopants, such as boron or $BF_2$; n-type dopants, such as phosphorus or arsenic; or combinations thereof. The doped regions may be formed directly on the substrate 100, in a P-well structure, in an N-well structure, in a dual-well structure, and/or using a raised structure. The substrate 100 may further include various active regions, such as regions configured for an N-type metal-oxide-semiconductor transistor device and regions configured for a P-type metal-oxide-semiconductor transistor device.

Reference is made to FIGS. 2A and 2B, in which FIG. 2A is a top view of one stage of manufacturing a semiconductor device, and FIG. 2B is a cross-sectional view along line B-B' of FIG. 2A. A first semiconductor layer 101 and a second semiconductor layer 102 are formed over the substrate 100. In some embodiments, the first semiconductor layer 101 is formed over the substrate 100, and the second semiconductor layer 102 is then formed over the first semiconductor layer 101. The first semiconductor layer 101 and the second semiconductor layer 102 may be formed by chemical vapor deposition (CVD), molecular beam epitaxy (MBE), or other suitable process(es).

In some embodiments, the first semiconductor layer 101 and the second semiconductor layer 102 may include different materials and/or components. For example, the first semiconductor layer 101 may be made from Si, SiGe, Ge, GeSn, SiGeSn, or combination thereof. On the other hand, the second semiconductor layer 102 may be made from Ge, SiGe, GeSn, SiGeSn, or combination thereof. The second semiconductor layer 102 can act as a channel layer of the semiconductor device, and the first semiconductor layer 101 can act as buffer layer between the second semiconductor layer 102 and the substrate 100. For example, in some embodiments where the second semiconductor layer 102 is directly formed on the substrate 100, of which the lattice constant of the second semiconductor layer 102 is far from the lattice constant of the substrate 100, the strong lattice mismatch may cause defects in the second semiconductor layer 102 and may affect the device performance. As such, the first semiconductor layer 101, which acts as a buffer layer between the substrate 100 and the second semiconductor layer 102, includes a lattice constant that is between the lattice constant of the substrate 100 and the lattice constant of the second semiconductor layer 102, so as to relax the strong lattice mismatch and can further reduce the defects in second semiconductor layer 102.

For example, in some embodiments where the substrate 100 is made of Si and the second semiconductor layer 102 is made of Ge, the first semiconductor layer 101 may be made of SiGe. In some embodiments where the substrate 100 is made of Si and the second semiconductor layer 102 is made of $Si_{1-x}$—$Ge_x$, the first semiconductor layer 101 may be made of $Si_{1-y}Ge_y$, in which x>y (x and y are integer). In some embodiments where the substrate 100 is made of Si and the second semiconductor layer 102 is made of $Ge_{1-x}Sn_x$, the first semiconductor layer 101 may be made of Ge, $Ge_{1-y}Sn_y$, or $Si_{1-p-q}Ge_pSn_q$, in which x>y and the lattice constant of $Ge_{1-x}Sn_x$ is greater than that of $Si_{1-p-q}Ge_pSn_q$ (x, y, p, and q are integer). In some embodiments where the substrate 100 is made of Si and the second semiconductor layer 102 is made of $Si_{1-x-y}Ge_xSn_y$, the first semiconductor layer 101 may be made of $Si_{1-p-q}Ge_pSn_q$, in which the lattice constant of $Si_{1-x-y}Ge_xSn_y$ is greater than that of $Si_{1-p-q}Ge_pSn_q$ (x, y, p, and q are integer).

Reference is made to FIGS. 3A and 3B, in which FIG. 3A is a top view of one stage of manufacturing a semiconductor device, and FIG. 3B is a cross-sectional view along line B-B' of FIG. 3A. A patterned mask 103 is formed over the first semiconductor layer 101 and the second semiconductor layer 102 to define a fin region in the following processes. In some embodiments, the patterned mask 103 is in contact with the second semiconductor layer 102. The patterned mask 103 may be formed from, for example, $Si_3N_4$ or other suitable materials.

Figure 4B:
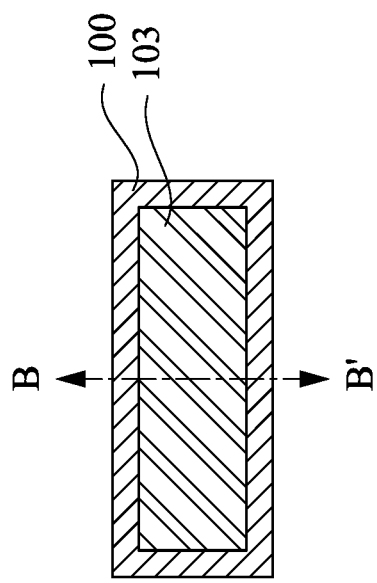

Reference is made to FIGS. 4A and 4B, in which FIG. 4A is a top view of one stage of manufacturing a semiconductor device, and FIG. 4B is a cross-sectional view along line B-B' of FIG. 4A. The substrate 100, the first semiconductor layer 101, and the second semiconductor layer 102 are patterned with the mask 103. After the patterning, the patterned substrate 100 includes a protrusion portion 1001, and the patterned first semiconductor layer 101 and the patterned second semiconductor layer 102 are disposed over the protrusion portion 1001, in which the first semiconductor layer 101 is in contact with the protrusion portion 1001. In some embodiments, the protrusion portion 1001, the patterned first semiconductor layer 101, and the patterned second semiconductor layer 102 have substantially the same width, and may be collectively referred to as a fin structure over the substrate 100.

The patterning may be performed using suitable process, such as etching. In some embodiments, the etching includes anisotropic etching, such as dry etching. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 5A:
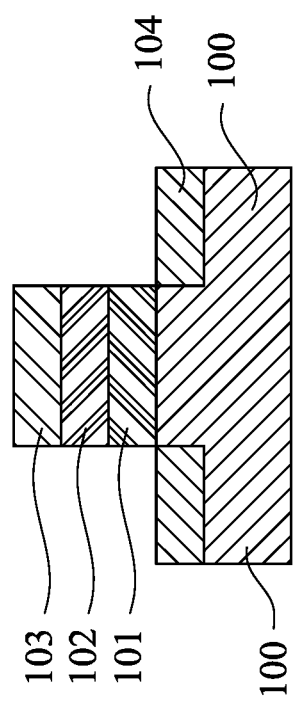
Figure 5B:
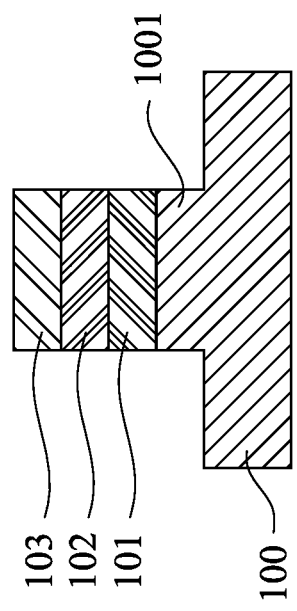

Reference is made to FIGS. 5A and 5B, in which FIG. 5A is a top view of one stage of manufacturing a semiconductor device, and FIG. 5B is a cross-sectional view along line A-A of FIG. 5A. An isolation structure 104 is formed over the substrate 100 and adjacent to the protrusion portion 1001 of the substrate 100. The isolation structure 104, which acts as a shallow trench isolation (STI) around the first and the second semiconductor layers 101 and 102 may be formed by performing a chemical vapor deposition (CVD), such as high density plasma CVD (HDPCVD), to form a dielectric material. Following a chemical mechanical polish (CMP) process is performed to level the top surface of the dielectric material with the top surface of the mask 103, and the dielectric material is etched back to form the isolation structure 104. In yet some other embodiments, the isolation structure 104 is an insulator layer of a SOI wafer.

Figure 6A:
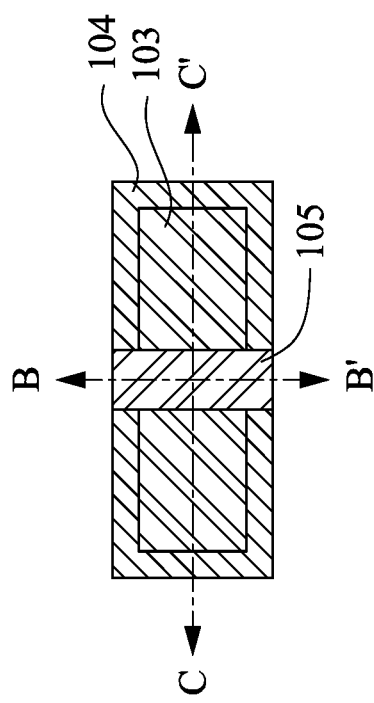
Figure 6C:
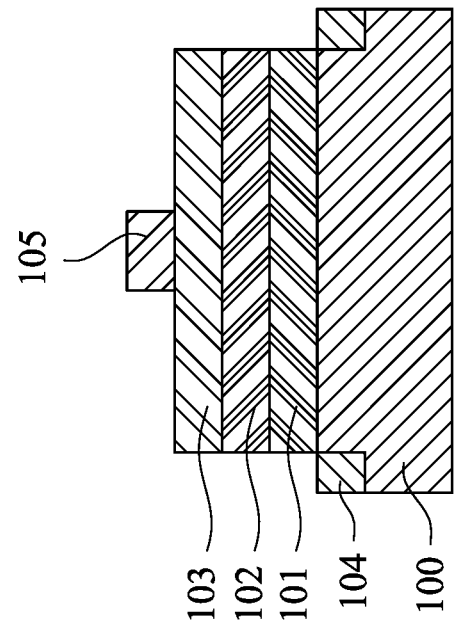
Figure 6B:
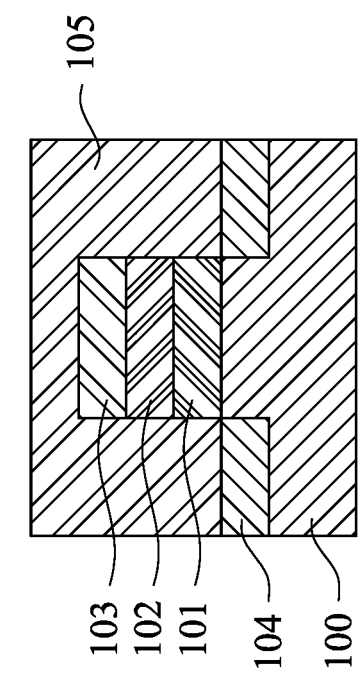

Reference is made to FIGS. 6A to 6C, in which FIG. 6A is a top view of one stage of manufacturing a semiconductor device, FIG. 6B is a cross-sectional view along line B-B' of FIG. 6A, and FIG. 6C is a cross-sectional view along line C-C' of FIG. 6A. A dummy gate structure 105 is formed over the substrate 100 and crossing the first semiconductor layer 101 and the second semiconductor layer 102.

In some embodiments, the dummy gate structure 105 includes a dummy gate electrode and a gate dielectric underlying the dummy gate electrode. The dummy gate electrode may include polycrystalline-silicon (poly-Si) or poly-crystalline silicon-germanium (poly-SiGe). Further, the dummy gate electrode may be doped poly-silicon with uniform or non-uniform doping. The gate dielectric may include, for example, silicon dioxide, silicon nitride, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In various examples, the gate dielectric may be deposited by an ALD process, a CVD process, a subatmospheric CVD (SACVD) process, a flowable CVD process, a PVD process, or other suitable process. By way of example, the gate dielectric may be used to prevent damage to the first semiconductor layer 101 and the second semiconductor layer 102 by subsequent processing (e.g., subsequent formation of the dummy gate electrode).

Figure 7A:
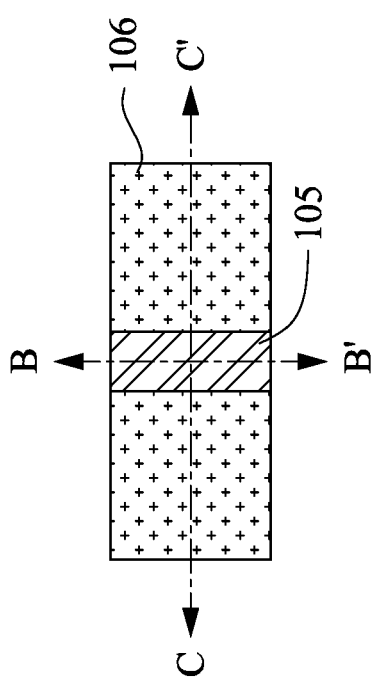
Figure 7C:
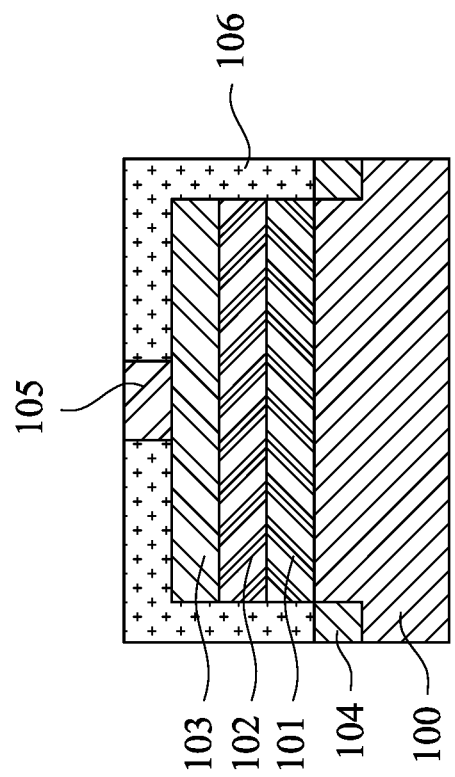
Figure 7B:
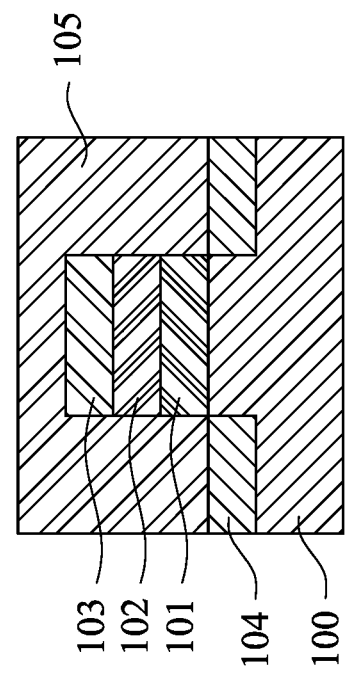

Reference is made to FIGS. 7A to 7C, in which FIG. 7A is a top view of one stage of manufacturing a semiconductor device, FIG. 7B is a cross-sectional view along line B-B' of FIG. 7A, and FIG. 7C is a cross-sectional view along line C-C' of FIG. 7A. An isolation material 106 is formed over the substrate 100. The isolation material 106 may be formed by suitable process, such as CVD or PVD. Further, a planarization process, such as chemical mechanical polishing (CMP), may be performed to the isolation material 106 until the dummy gate structure 105 is exposed, such that top surfaces of the isolation material 106 and the dummy gate structure 105 are substantially coplanar. In some embodiments, the isolation material 106 may be SiOC, or other suitable materials. In some other embodiments, the isolation material 106 may include material similar to the isolation structure 104.

Figure 8C:
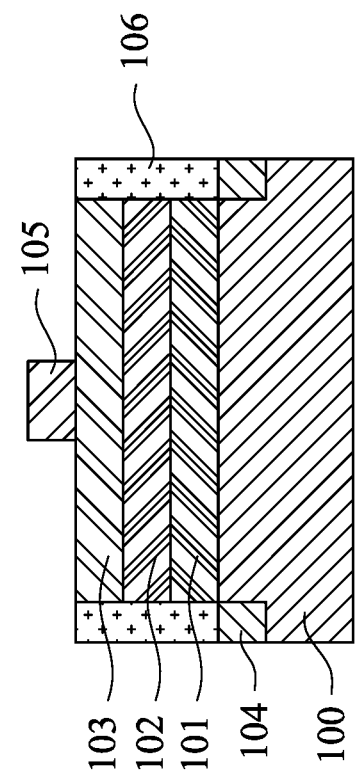
Figure 8A:
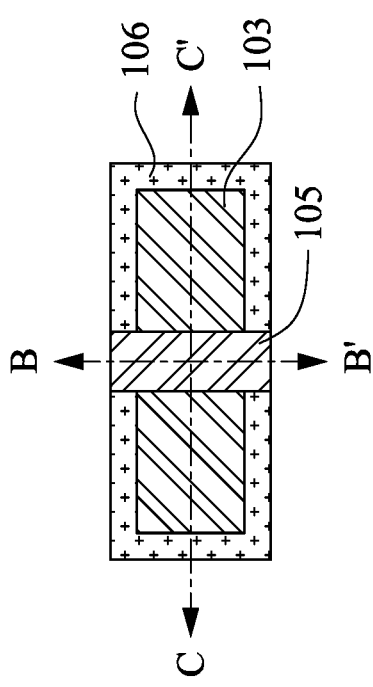
Figure 8B:
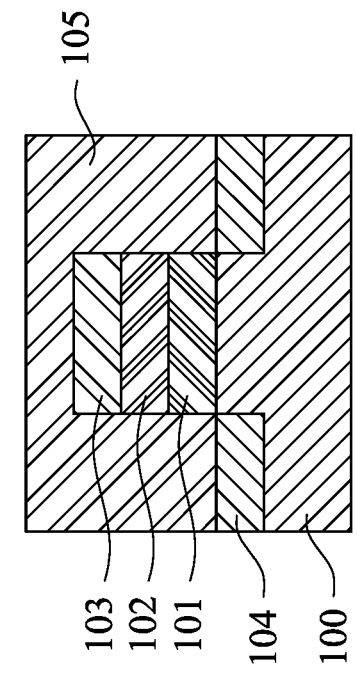

Reference is made to FIGS. 8A to 8C, in which FIG. 8A is a top view of one stage of manufacturing a semiconductor device, FIG. 8B is a cross-sectional view along line B-B' of FIG. 8A, and FIG. 8C is a cross-sectional view along line C-C' of FIG. 8A. The isolation material 106 is partially removed by, for example, dry etching. Accordingly, the mask 103 is exposed from the isolation material 106 and the dummy gate structure 105. In some embodiments, the top surface of the remained isolation material 106 is substantially level with the top surface of the mask 103.

Figure 9A:
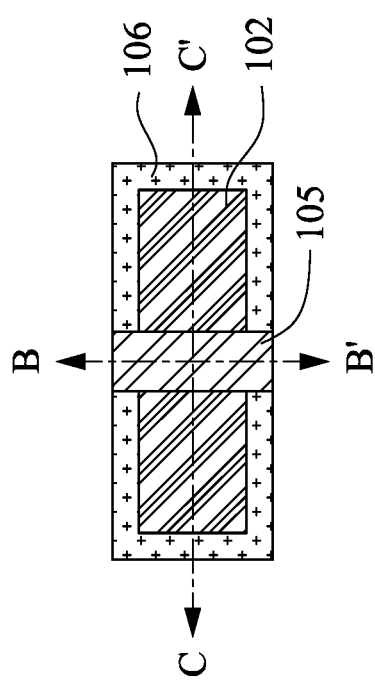
Figure 9C:
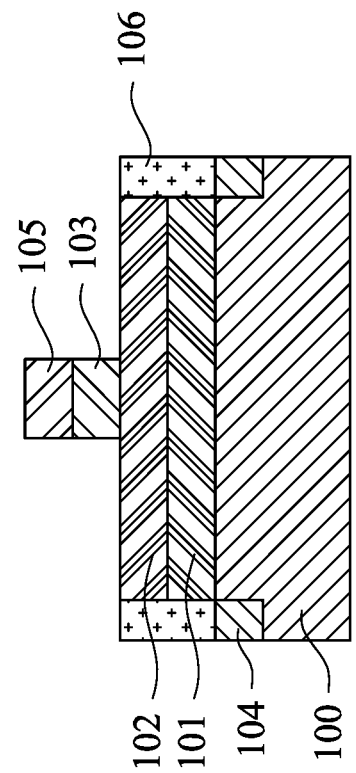
Figure 9B:
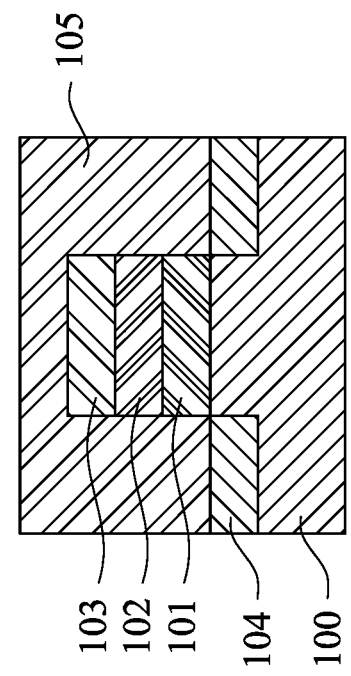

Reference is made to FIGS. 9A to 9C, in which FIG. 9A is a top view of one stage of manufacturing a semiconductor device, FIG. 9B is a cross-sectional view along line B-B' of FIG. 9A, and FIG. 9C is a cross-sectional view along line C-C' of FIG. 9A. The mask 103 is patterned using the dummy gate structure 105 as a mask. After the mask 103 is patterned, the second semiconductor layer 102 is exposed from the isolation material 106 and the dummy gate structure 105. The mask 103 may be patterned by, for example, dry etching. In some embodiments, the etchants may be $CHF_3$ and Ar. The isolation material 106 may also be patterned during patterning the mask 103. In other words, the mask 103 and the isolation material 106 may be patterned at the same time.

Reference is made to FIGS. 10A to 10C, in which FIG. 10A is a top view of one stage of manufacturing a semiconductor device, FIG. 10B is a cross-sectional view along line B-B' of FIG. 10A, and FIG. 10C is a cross-sectional view along line C-C' of FIG. 10A. Plural gate spacers 107 are formed on opposite sidewalls of the dummy gate structure 105 and the mask 103. In some embodiments, the gate spacers 107 may include single or multiple layers. The gate spacers 107 can be formed by blanket depositing one or more dielectric layer(s) (not shown) on the previously formed structure. The dielectric layer(s) may include porous SiOC, silicon nitride (SiN), oxynitride, silicon carbon (SiC), silicon oxynitride (SiON), oxide, and the like. The gate spacers 107 may be formed by methods such as CVD, plasma enhanced CVD, sputter, or the like. The gate spacers 107 may then be patterned, such as by one or more etch processes to remove horizontal portions of the gate spacers 107 from the horizontal surfaces of the structure.

Reference is made to FIGS. 11A to 11C, in which FIG. 11A is a top view of one stage of manufacturing a semiconductor device, FIG. 11B is a cross-sectional view along line B-B' of FIG. 11A, and FIG. 11C is a cross-sectional view along line C-C' of FIG. 11A. The first semiconductor layer 101 and the second semiconductor layer 102 are patterned using the dummy gate structure 105 and the gate spacers 107 as a mask. The first semiconductor layer 101 and the second semiconductor layer 102 may be patterned by suitable process, such as etching. After the patterning, recesses $R_1$ are formed over the substrate 100, in which at least one of the recesses $R_1$ is defined by the isolation material 106 and the semiconductor layers 101 and 102. Then, plural source/drain structures 108 are formed in the recesses $R_1$, respectively. Accordingly, the source/drain structures 108 are in contact with the isolation material 106 and the semiconductor layers 101 and 102. Since the substrate 100 is a crystalline structure, the source/drain structures 108 are also crystalline.

In some embodiments, the source/drain structures 108 may be epitaxy structures, and may also be referred to as epitaxy structures 108. The source/drain structures 108 may be formed using one or more epitaxy or epitaxial (epi) processes. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the substrate 100 (e.g., silicon). In some embodiments, lattice constants of the source/drain structures 108 are different from lattice constant of the second semiconductor layer 102, such that the second semiconductor layer 102 is strained or stressed to enable carrier mobility of the semiconductor device and enhance the device performance.

In some embodiments, the source/drain structures 108 may include $Ge_xSn_{1-x}$, where $0<x\leq1$, which provides appropriate stress to the second semiconductor layer 102. For example, the source/drain structures 108 may include $Ge_{0.92}Sn_{0.08}$, but the concentration percentages of Ge and Sn may vary in variant embodiments. The epitaxy processes may be performed under pressure in a range from about 1 Torr to about 760 Torr, and temperature in a range from about 200° C. to about 400° C. The epitaxial processes may include a Ge-containing gas, such as $GeH_4$, $Ge_2H_6$, or other germanium halides as Ge-precursor with flow rate in a range from about 1 sccm to about 200 sccm; a Sn-containing gas, such as $SnCl_4$ or $SnD_4$ as Sn-precursor with flow rate in a range from about 1 sccm to about 500 sccm. The epitaxial processes may also include $H_2$ and/or $N_2$ as a carrier gas in a chamber, in which the flow rate of $H_2$ gas is in a range from about 0 SLM (Standard Liter per Minute) to about 20 SLM, and the flow rate of $N_2$ gas is in a range from about 0 SLM to about 200 SLM.

Further, the source/drain structures 108 may be in-situ doped during the epitaxial processes. In some embodiments, B or P can be in-situ doped. For example, $B_2H_6$ gas with flow rate in a range from about 0 sccm to about 500 sccm may be used as p-type dopant precursor, and $PH_3$ gas with flow rate in a range from about 0 sccm to about 1000 sccm may be used for n-type dopant. In some other embodiments, the source/drain structures 108 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

Reference is made to FIGS. 12A to 12C, in which FIG. 12A is a top view of one stage of manufacturing a semiconductor device, FIG. 12B is a cross-sectional view along line B-B' of FIG. 12A, and FIG. 12C is a cross-sectional view along line C-C' of FIG. 12A. A dopant drive-in process is performed to facilitate dopant diffusion into the source/drain structures 108 after the formation of the source/drain structures 108. In some embodiments, the source/drain structures 108 are exposed to a dopant-containing gas to diffuse a dopant into regions of the source/drain structures 108. Therefore, the dopant concentration is dense near the top surface of the source/drain structures 108 and drops as the depth of the source/drain structures 108 increases, such that plural dopant-containing regions 109 are formed in the source/drain structures 108, respectively. The dopant concentration in the dopant-containing region 109 is greater than the dopant concentration in the source/drain structure 108. Since the dopant-containing gas is diffused into the source/drain structures 108 through the exposed surfaces of the source/drain structures 108, the dopant-containing regions 109 are at tops of the source/drain structures 108, respectively. Since the source/drain structures 108 a crystalline structure, the dopant-containing regions 109 is also crystalline. In some embodiments, the thickness of the dopant-containing regions 109 is in a range from about 0.1 nm to about 100 nm.

For example, the dopant-containing gas may include boron, such as $B_2H_6$. The dopant drive-in process may be employed in an environment having a pressure in a range from about 1 Torr to about 760 Torr, and at a temperature in a range from about 200° C. to about 400° C. In some other embodiments, the dopant drive-in process may be employed in a temperature lower than a (re)crystallization temperature of the source/drain structures 108, such as in temperature range of about 200° C. to about 400° C. (about 320° C. for example). In some embodiments, dopant-containing gas, such as $B_2H_6$, is import with a flow rate in a range from about 1 sccm to about 500 sccm. Also, the dopant drive-in process may also include $H_2$ and/or $N_2$ as a carrier gas in a chamber, in which the flow rate of $H_2$ gas is in a range from about 0 SLM to about 20 SLM, and the flow rate of $N_2$ gas is in a range from about 0 SLM to about 200 SLM.

Reference is made to FIGS. 13A to 13C, in which FIG. 13A is a top view of one stage of manufacturing a semiconductor device, FIG. 13B is a cross-sectional view along line B-B' of FIG. 13A, and FIG. 13C is a cross-sectional view along line C-C' of FIG. 13A. After the dopant drive-in process proceeds a period of time, dopant-containing layers 110 may be formed on the exposed surfaces of the source/drain structures 108, respectively, due to the dopant saturation in the dopant-containing regions 109. That is, the dopant amount in the dopant-containing regions 109 is saturated, and the excess dopants form the dopant-containing layers 110 thereon. In other words, the dopant-containing layers 110 are formed on and in contact with the dopant-containing regions 109 of the source/drain structures 108. The dopant-containing layers 110 contain a dopant similar to the dopant-containing gas of the dopant drive-in process, such as boron. In some embodiments, the dopant-containing layers 110 may be a pure boron layer, or a compound layer including boron. Thus, the dopant-containing layers 110 may include higher boron concentration than the dopant-containing regions 109. Further, the dopant-containing layers 110 may also act as a dopant source for diffusing the dopant into the source/drain structures 108 and continuously contribute the dopant-containing regions 109. Thus, the dopant drive-in process may also be referred to as a solid phase diffusion process. In some embodiments, the thickness of the dopant-containing layers 110 may be in a range from about 0 nm to about 100 nm. In variant embodiments, the process duration of the dopant drive-in process may be tuned, such that the dopant-containing layers 110 may not be formed. That is, the dopants are not saturated in the dopant-containing regions 109, and the top surfaces of the dopant-containing regions 109 remain exposed during the dopant drive-in process. Accordingly, the dopant-containing regions 109 of the source/drain structures 108 are formed by dopant diffusion through the dopant-containing gas, and the dopant drive-in process may also be referred to as a gas phase diffusion process. In some embodiments, the dopant-containing layers 110 may have a thickness in a range from about 0 to 100 nm.

Figure 14C:
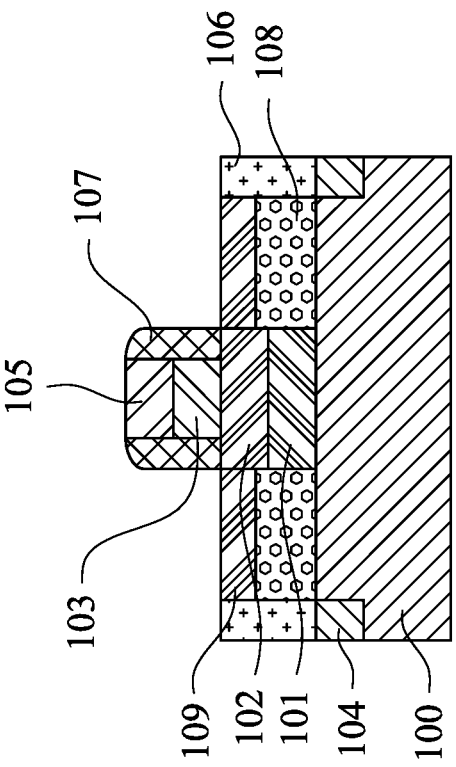
Figure 14A:
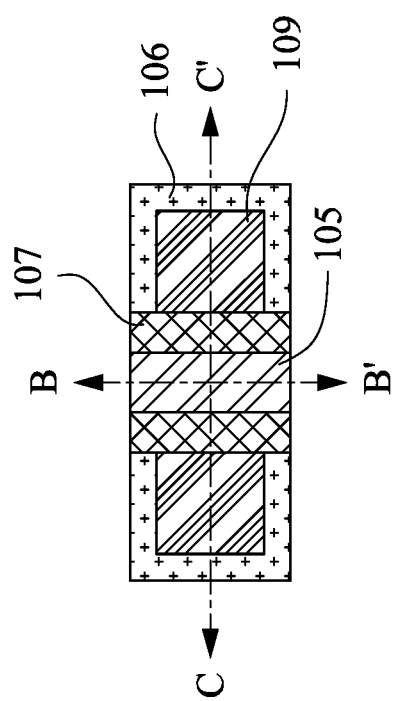
Figure 14B:
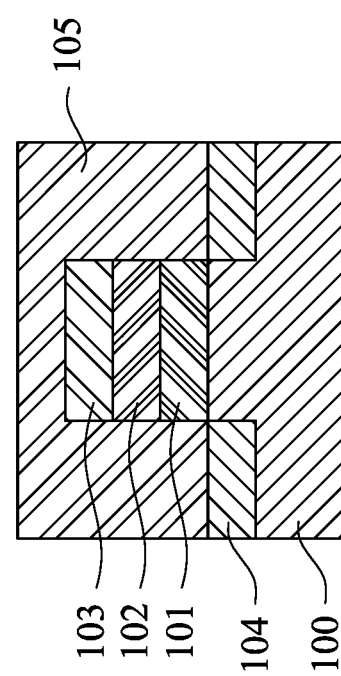

Reference is made to FIGS. 14A to 14C, in which FIG. 14A is a top view of one stage of manufacturing a semiconductor device, FIG. 14B is a cross-sectional view along line B-B' of FIG. 14A, and FIG. 14C is a cross-sectional view along line C-C' of FIG. 14A. The dopant-containing layers 110 (referring to FIGS. 13A and 13C) are removed by suitable process, such as etching. Accordingly, the top surfaces of the source/drain structures 108 are exposed. In other words, the dopant-containing regions 109 of the source/drain structures 108 are exposed. In some embodiments, the etchant for removing the dopant-containing layers 110 may include $H_3PO_4$, $HNO_3$, $H_2SO_4$, $H_2O_2$, oxidant, or other suitable etchants. For example, the dopant-containing layers 110 may be removed by wet etching using heated $H_3PO_4$ at a temperature about 150° C. for about 1 minute.

After the dopant drive-in process, the source/drain structures 108 include dopant-containing regions 109 disposed on the tops of the source/drain structure 108. In some embodiments, the average dopant concentration (such as boron concentration) of the dopant-containing region 109 may be in a range from about $1 \times 10^{17}$ at/cm$^3$ to about $1 \times 10^{22}$ at/cm$^3$. In some embodiments, the peak dopant concentration (such as boron concentration) of the dopant-containing region 109 may be in a range from about $1 \times 10^{19}$ cm$^{-3}$ to about $1 \times 10^{22}$ cm$^{-3}$. Thus, the dopant-containing regions 109 may also be referred to as heavily-doped regions 109. In some embodiments, the average concentration of Sn in the GeSn source/drain structures 108 is in a range from about 1 at % to about 20 at %.

In some embodiments, if an epitaxy structure, which includes GeSn, is subject to a boron implantation and then a thermal process (such as annealing process) or an in-situ boron doping process, the boron atoms tend to occupy substitutional Sn sites rather than Ge sites to obtain lower formation energy. As a result, the Sn concentration of the GeSn epitaxy structure may decrease accordingly. However, since the dopant drive-in process described in FIGS. 12A to 13C is performed in a low temperature, such as temperature lower than about 320° C., the dopant drive-in process has low thermal budget. As such, the energy of the dopant drive-in process is not high enough to break the bonding between atoms (i.e. Ge—Sn) of the source/drain structures 108, and thus the boron atoms may not substitute the Sn atoms. Accordingly, during the dopant drive-in process, the reduction of the Sn concentration of the source/drain structures 108 may be lower than about 1%. Thus, the source/drain structures 108 may include dopant-containing regions 109 with higher Sn concentration. In some embodiments, the doped regions 109 have a boron concentration greater than about $1 \times 10^{20}$ at/cm$^3$ and a tin concentration greater than about 8 at %. If the boron concentration of the doped regions 109 is less than about $1 \times 10^{20}$ at/cm$^3$, the boron concentration of the doped regions 109 might be unsatisfactory for the source/drain structures 108. A lattice constant of tin is greater than a lattice constant of germanium. The source/drain structures 108 having a higher tin concentration can act as a stressor and can provide more compressive strain to a gate channel due to the increased lattice constant. Since boron is diffused into the doped regions 109, and no thermal process (such as annealing process) is performed after doping the source/drain structures 108, the tin concentration of the doped regions 109 would not be reduced. In other words, the dopant drive-in process is performed at a temperature that is under a recrystallization temperature of the source/drain structures 108 during the dopant drive-in process. In some embodiments, the tin concentration of the doped regions 109 is greater than about 8 at %. If the tin concentration of the doped regions 109 is lower than about 8 at %, the doped regions 109 might not provide enough compressive strain to the gate channel, which might in turn adversely affect the device performance.

On the other hand, since the dopant is diffused through the exposed surface of the source/drain structures 108, the peak dopant concentration of the dopant-containing regions 109 is located at the top of the dopant-containing regions 109, and the dopant concentration of the dopant-containing regions 109 may decrease from the top of the dopant-containing regions 109 to the bottom of the dopant-containing regions 109. In some embodiments, the abruptness of the dopant profile (such as boron) in the dopant-containing regions 109 may be in a range from about 1 nm/decade to about 5 nm/decade. If the abruptness is greater than about 5 nm/decade, the dopant-containing regions 109 may be formed by performing a process other than the dopant drive-in process mentioned above. For example, the abruption of the dopant profile is greater than about 14 nm/decade if an implantation process, which creats high thermal budget, is performed to form the dopant-containing regions 109. The abruptness is defined by a depth when the dopant concentration drops a decade from $1 \times 10^{19}$ cm$^{-3}$ to $1 \times 10^{18}$ cm$^{-3}$.

As discussed above, after forming source/drain structures, a dopant drive-in process is performed to facilitate dopant diffusion into the source/drain structures. During the dopant drive-in process, the source/drain structures are exposed to a dopant-containing gas diffuse a dopant into regions of the source/drain structure with low thermal budget. As such, the crystallization of the source/drain structures may not be destroyed, because the dopant is driven into the source/drain structures by diffusion mechanism, not a high power implantation process that may destroy the crystallization of the source/drain structures. As a result, the entire source/drain structures may be single crystalline. Stated another way, the entire source/drain structures may include uniform crystallization type. Further, the source/drain structures may include both higher Sn concentration and boron concentration, because the process is performed with a low thermal budget such that the boron atoms may not occupy the Sn atoms. In contrast, if the source/drain structures are subject to a higher power process, such as an dopant implantation, the boron atoms tend to occupy substitutional Sn sites rather than Ge sites to obtain lower formation energy, such that the Sn concentration of the source/drain structures may decrease accordingly. In this way, the source/drain structures with higher Sn concentration may act as a stressor to provide more compressive strain to a gate channel, and the higher boron concentration may also reduce the contact resistance and increase carrier density. Accordingly, the device performance may be improved.

Figure 15A:
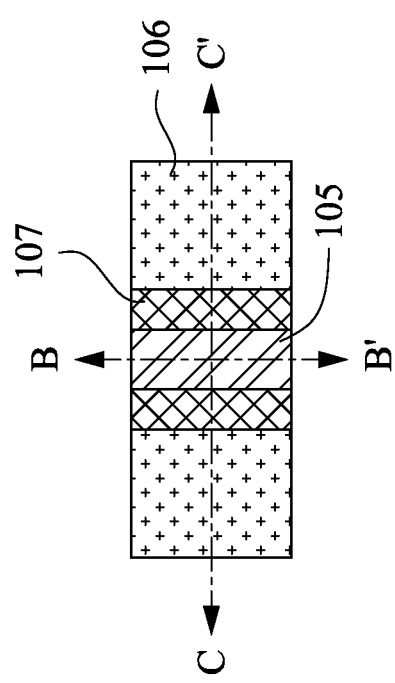
Figure 15B:
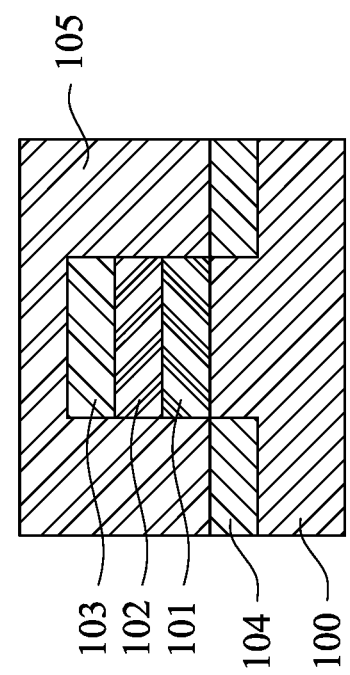
Figure 15C:
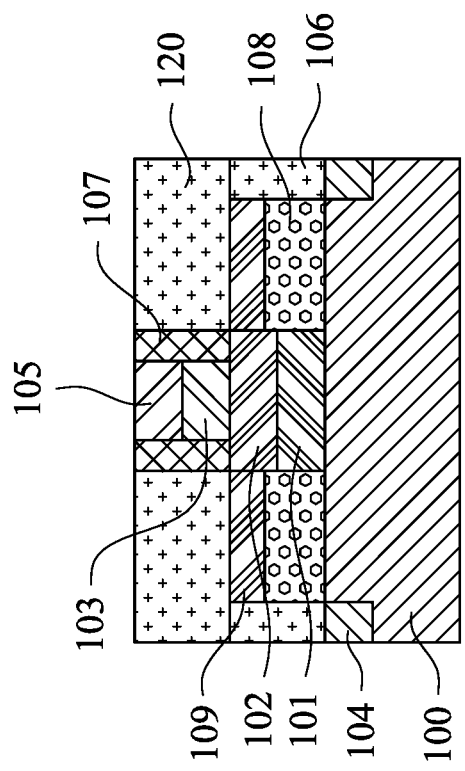

Reference is made to FIGS. 15A to 15C, in which FIG. 15A is a top view of one stage of manufacturing a semiconductor device, FIG. 15B is a cross-sectional view along line B-B' of FIG. 15A, and FIG. 15C is a cross-sectional view along line C-C' of FIG. 15A. An isolation material 120 is formed over the substrate 100. In some embodiments, the material of the isolation material 120 is the same as the isolation material 106 described in FIGS. 7A to 7C. However, the material of the isolation material 120 can be different from the isolation material 106 in some other embodiments. Further, a planarization process, such as chemical mechanical polishing (CVD), may be performed to the isolation material 120 until the dummy gate structure 105 is exposed, such that top surfaces of the isolation material 120, the dummy gate structure 105, and the gate spacers 107 are substantially coplanar. The isolation material 120 is in contact with the dopant-containing region 109 of the source/drain structures 108. It is noted that, during the dopant drive-in process and before forming the isolation material 120, the structure is at a temperature that is under a recrystallization temperature of the source/drain structures 108.

Figure 16A:
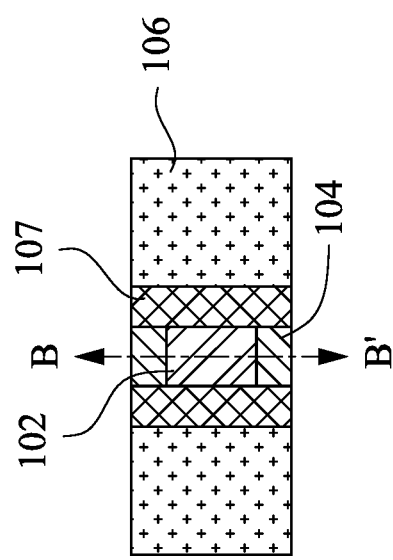
Figure 16B:
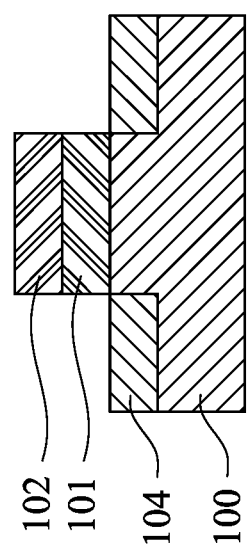

Reference is made to FIGS. 16A and 16B, in which FIG. 16A is a top view of one stage of manufacturing a semiconductor device, and FIG. 16B is a cross-sectional view along line B-B' of FIG. 16A. In some embodiments, a replacement gate (RPG) process scheme is employed. In a RPG process scheme, a dummy polysilicon gate (the dummy gate electrode in this case) is formed first and is replaced later by a metal gate after high thermal budget processes are performed. In some embodiments, the dummy gate structure 105 and the mask 103 are removed to form an opening with the spacers 107 as its sidewall. The dummy gate structure 105 and the mask 103 may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 17A:
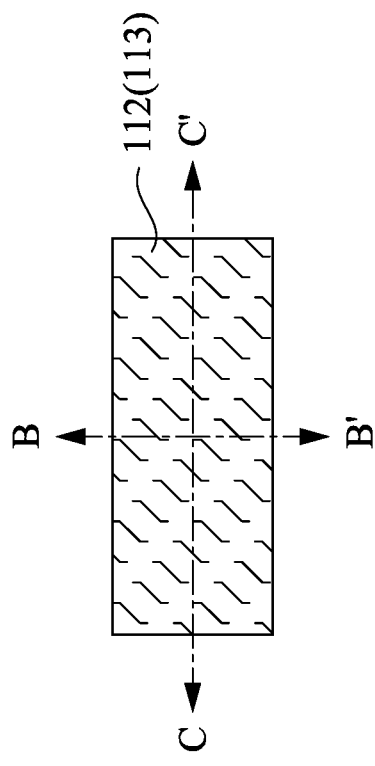
Figure 17B:
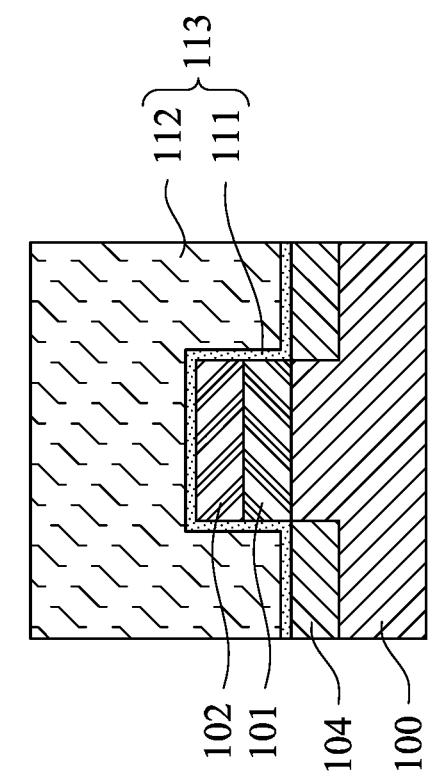
Figure 17C:
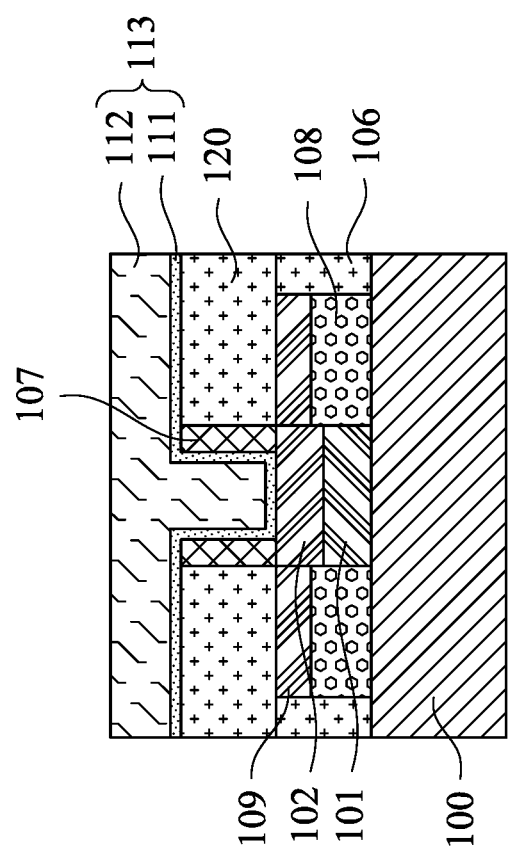

Reference is made to FIGS. 17A to 17C, in which FIG. 17A is a top view of one stage of manufacturing a semiconductor device, FIG. 17B is a cross-sectional view along line B-B' of FIG. 17A, and FIG. 17C is a cross-sectional view along line C-C' of FIG. 17A. A gate stack 113 is formed crossing and in contact with the first semiconductor layer 101 and the second semiconductor layer 102.

The gate stack 113 includes a gate dielectric 111 conformally formed on exposed surfaces of the first semiconductor layer 101 and the second semiconductor layer 102, and a gate metal 112 formed over the gate dielectric 111. The gate dielectric 111, as used and described herein, includes dielectric materials having a high dielectric constant, for example, greater than that of thermal silicon oxide (~3.9). The gate metal 112 may include a metal, metal alloy, and/or metal silicide.

In some embodiments, the gate metal 112 included in the gate stack 113 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide. For example, the gate metal 112 formed may also include capping layer(s), work function metal layer(s), fill layer(s), and/or other suitable layers that are desirable in a metal gate structure. A work function metal layer included in the gate metal 112 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electro-plating and/or other suitable process. In some embodiments, the capping layer included in the gate metal 112 may include refractory metals and their nitrides (e.g. TiN, TaN, $W_2N$, TiSiN, TaSiN). The cap layer of the gate metal 112 may be deposited by PVD, CVD, metal-organic chemical vapor deposition (MOCVD) and ALD. In some embodiments, the fill layer included in the gate metal 112 may include tungsten (W). The metal layer may be deposited by ALD, PVD, CVD, or other suitable process.

In some embodiments, the gate dielectric 111 may include a dielectric material such as silicon oxide ($SiO_2$), HfSiO, and/or silicon oxynitride (SiON). The interfacial layer may be formed by chemical oxidation, thermal oxidation, ALD, CVD, and/or other suitable method. The gate dielectric 111 may include a high-K dielectric layer such as hafnium oxide (HfO2). Alternatively, the gate dielectric 111 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric 111 may be formed by ALD, PVD, CVD, oxidation, and/or other suitable methods.

Figure 18A:
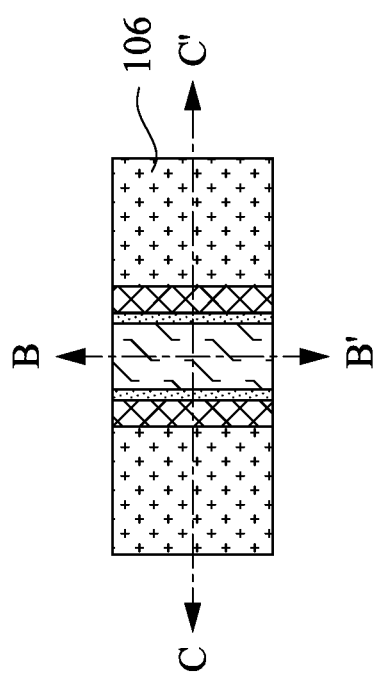
Figure 18B:
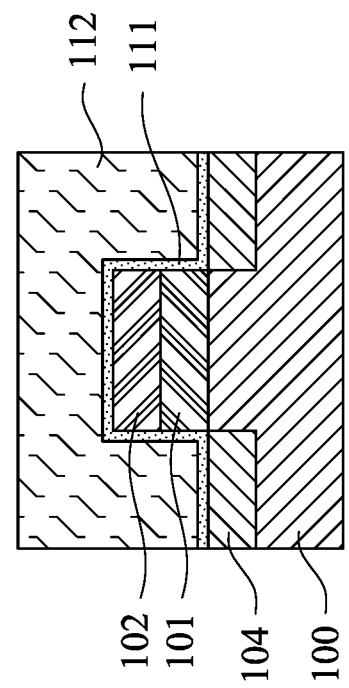
Figure 18C:
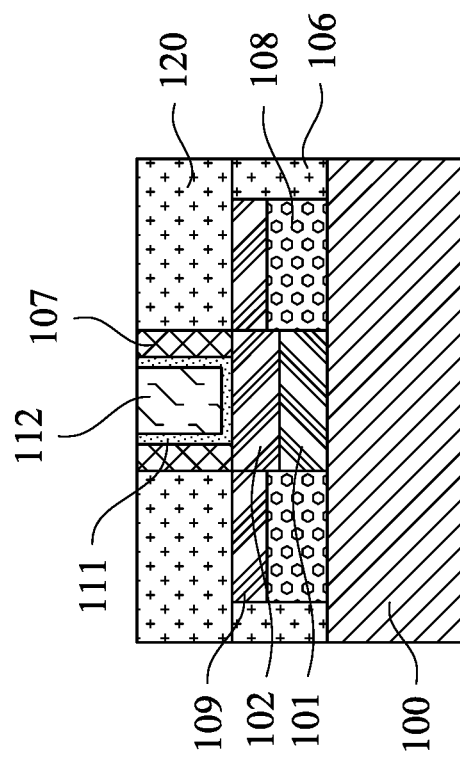

Reference is made to FIGS. 18A to 18C, in which FIG. 18A is a top view of one stage of manufacturing a semiconductor device, FIG. 18B is a cross-sectional view along line B-B' of FIG. 18A, and FIG. 18C is a cross-sectional view along line C-C' of FIG. 18A. A planarization process, such as CMP, is performed to the gate stack 113 until the isolation material 120 is exposed.

Figure 19B:
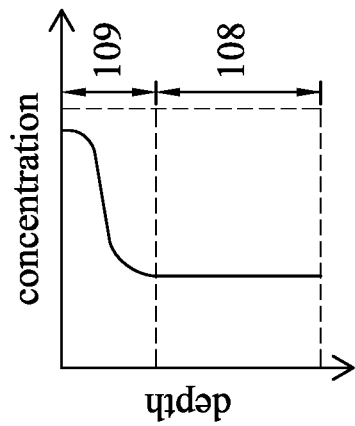
FIGS. 19A and 19B are dopant concentration profiles of a source/drain region of a semiconductor device in accordance with some embodiments.
Figure 19A:
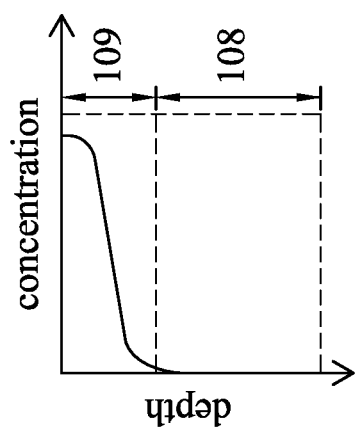

FIGS. 19A and 19B are dopant concentration profiles of the source/drain region of the semiconductor device of FIG. 18C in accordance with some embodiments. In these figures, the horizontal axis represents the dopant concentration of the source/drain region of the semiconductor device of FIG. 18C (e.g. the source/drain structure 108 and the dopant-containing region 109), and the vertical axis represents the depth of the source/drain region of the semiconductor device of FIG. 18C.

Reference is made to FIG. 19A. The dopant concentration of the dopant-containing region 109 decreases as the depth increases, since the dopants diffuse downwardly from the top of the source/drain region. In some embodiments, the dopant concentration distribution of the dopant-containing region 109 is close to an error function (erf). In some embodiments where the source/drain structure 108 is un-doped, the dopant concentration of the source/drain structure 108 is substantially equal to 0. That is, the source/drain structure 108 is substantially free from dopants.

Reference is made to FIG. 19B. The dopant concentration of the dopant-containing region 109 decreases as the depth increases, since the dopants diffuse downwardly from the top of the source/drain region. In some embodiments, the dopant concentration distribution of the dopant-containing region 109 is close to an error function (erf). In some embodiments where the source/drain structure 108 is in-situ doped, the dopant concentration of the source/drain structure 108 has an initial value that is larger than 0.

FIGS. 20A to 41C illustrate a method of manufacturing a semiconductor device at various stages in accordance with some embodiments. Some relevant structural and manufacturing details of the semiconductor device of FIGS. 20A to 41C are similar to those described in FIGS. 1A to 18C, and, therefore, similar descriptions in this regard will not be repeated hereinafter.

Figure 20A:
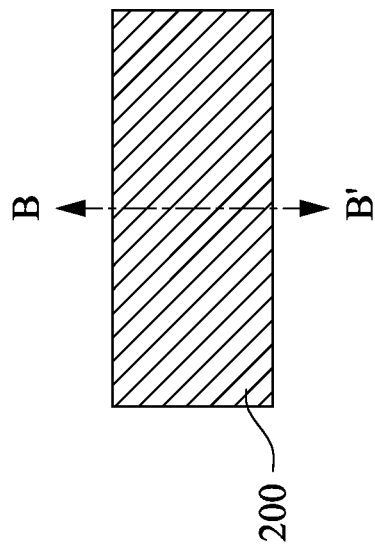
Figure 20B:
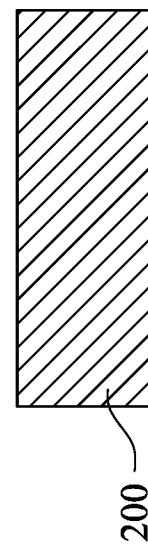

Reference is made to FIGS. 20A and 20B, in which FIG. 20A is a top view of one stage of manufacturing a semiconductor device, and FIG. 20B is a cross-sectional view along line B-B' of FIG. 20A. A substrate 200 is provided. The structure and material of the substrate 200 may be the same as or similar to the substrate 100 of FIGS. 1A and 1B.

Figure 21A:
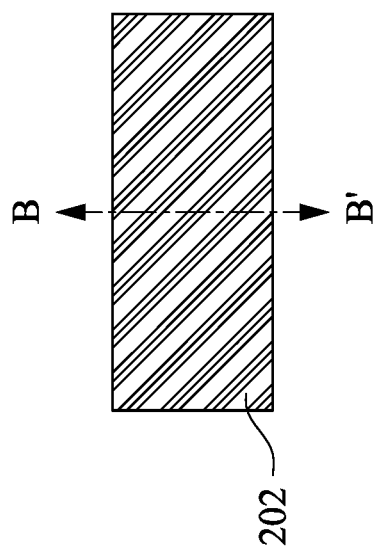
Figure 21B:
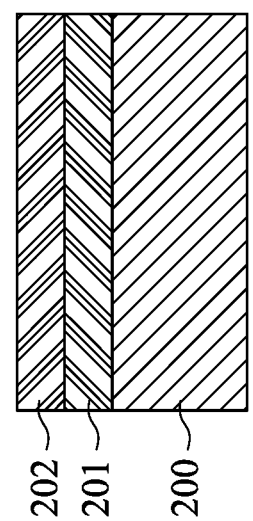

Reference is made to FIGS. 21A and 21B, in which FIG. 21A is a top view of one stage of manufacturing a semiconductor device, and FIG. 21B is a cross-sectional view along line B-B' of FIG. 21A. A first semiconductor layer 201 and a second semiconductor layer 202 are formed over the substrate 200. The structure and material of the first semiconductor layer 201 and the second semiconductor layer 202 may respectively be the same as or similar to the first semiconductor layer 101 and second semiconductor layer 102 described in FIGS. 2A and 2B.

Figure 22A:
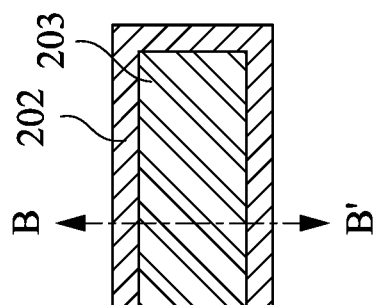
Figure 22B:
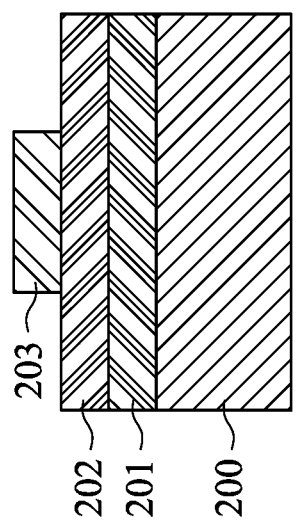

Reference is made to FIGS. 22A and 22B, in which FIG. 22A is a top view of one stage of manufacturing a semiconductor device, and FIG. 22B is a cross-sectional view along line B-B' of FIG. 22A. A patterned mask 203 is formed over the first semiconductor layers 201 and the second semiconductor layers 202 to define a fin region in the following process. The structure and material of the patterned mask 203 may be the same as or similar to the patterned mask 103 described in FIGS. 3A and 3B.

Figure 23A:
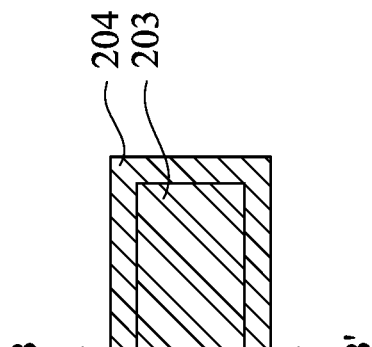
Figure 23B:
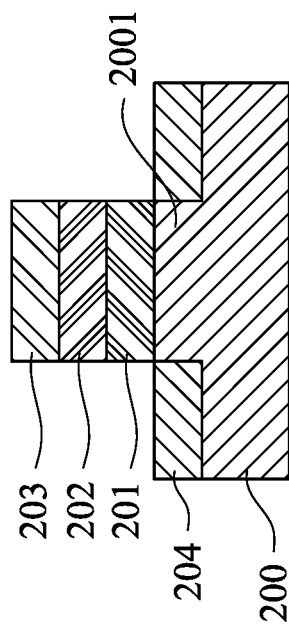

Reference is made to FIGS. 23A and 23B, in which FIG. 23A is a top view of one stage of manufacturing a semiconductor device, and FIG. 23B is a cross-sectional view along line B-B' of FIG. 23A. The substrate 200, the first semiconductor layer 201, and the second semiconductor layer 202 are patterned with the mask 203. After the patterning, the substrate 200 includes a protrusion portion 2001.

The first semiconductor layer 201, the second semiconductor layer 202, and the protrusion portion 2001 may collectively be referred to as a fin structure.

Figure 24A:
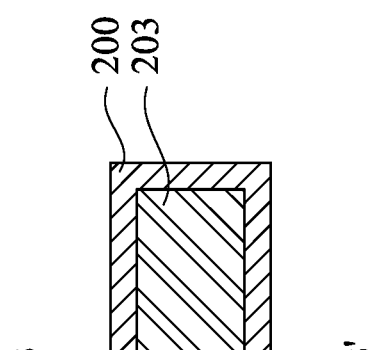
Figure 24B:
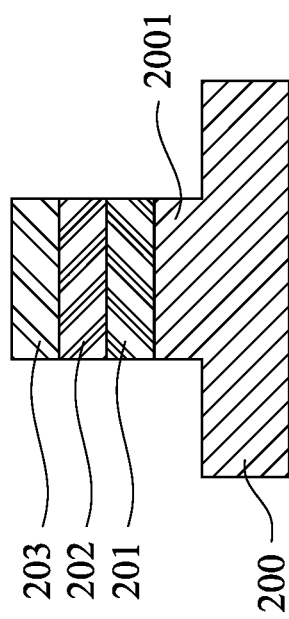

Reference is made to FIGS. 24A and 24B, in which FIG. 24A is a top view of one stage of manufacturing a semiconductor device, and FIG. 24B is a cross-sectional view along line B-B' of FIG. 24A. An isolation structure 204 is formed over the substrate 200 and adjacent to the protrusion portion 2001 of the substrate 200. The isolation structure 204 may be formed by depositing a dielectric material over the substrate and following with a planarization process until the mask 203 is exposed. In some embodiments, the isolation structure 204 is in contact with the first semiconductor layers 201, the second semiconductor layers 202, and the mask 203. The material of the isolation structure 204 may be the same as or similar to the isolation structure 104 described in FIGS. 5A and 5B.

Figure 25C:
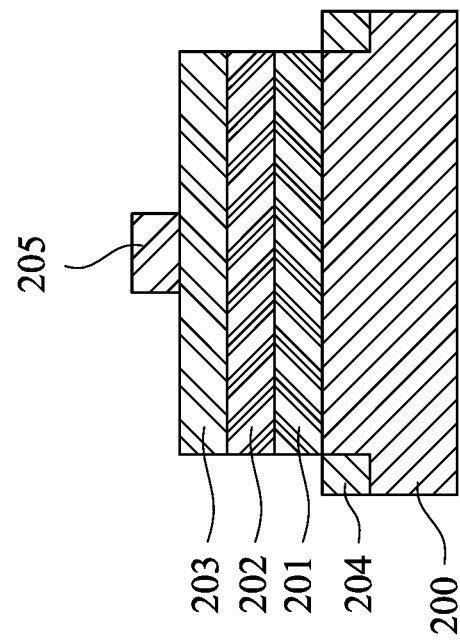
Figure 25A:
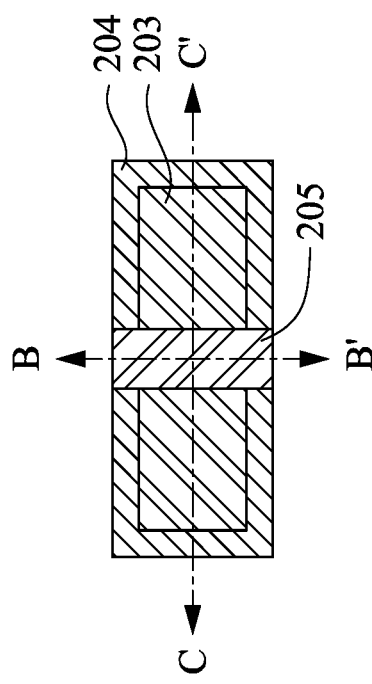
Figure 25B:
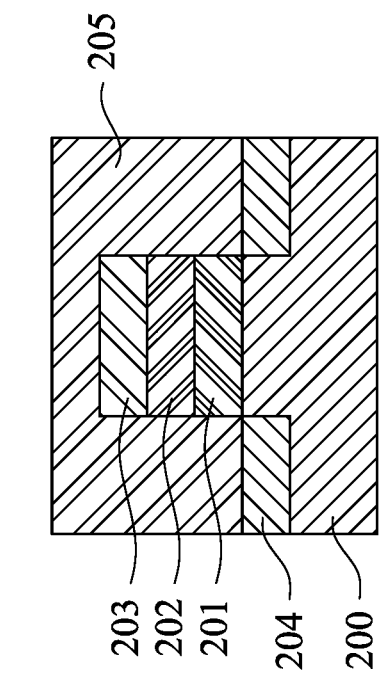

Reference is made to FIGS. 25A to 25C, in which FIG. 25A is a top view of one stage of manufacturing a semiconductor device, FIG. 25B is a cross-sectional view along line B-B' of FIG. 25A, and FIG. 25C is a cross-sectional view along line C-C' of FIG. 25A. A dummy gate structure 205 is formed over the substrate 200 and crossing the first semiconductor layer 201, the second semiconductor layer 202, and the mask 203. The structure and material of the dummy gate structure 205 may be the same as or similar to the dummy gate structure 105 described in FIGS. 6A to 6C.

Reference is made to FIGS. 26A to 26C, in which FIG. 26A is a top view of one stage of manufacturing a semiconductor device, FIG. 26B is a cross-sectional view along line B-B' of FIG. 26A, and FIG. 26C is a cross-sectional view along line C-C' of FIG. 26A. An isolation material 206 is formed over the substrate 200. Further, a planarization process, such as chemical mechanical polishing (CVD), may be performed to the isolation material 206 until the dummy gate structure 205 is exposed, such that top surfaces of the isolation material 206 and the dummy gate structure 205 are substantially coplanar. The structure material of the isolation material 206 may be the same as or similar to the isolation material 106 described in FIGS. 7A to 7C.

Figure 27A:
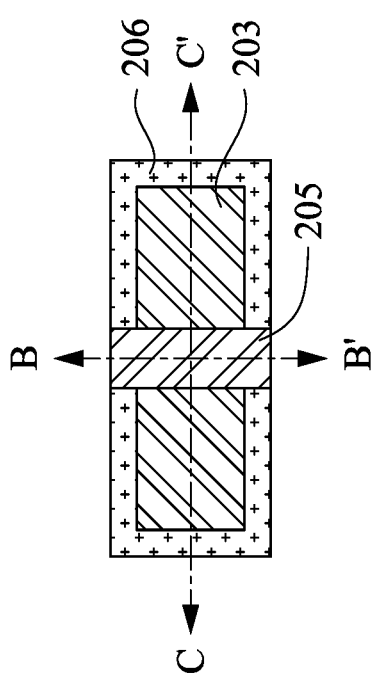
Figure 27C:
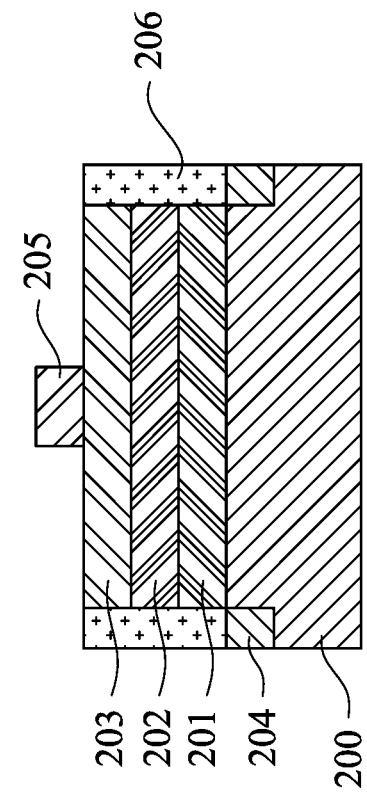
Figure 27B:
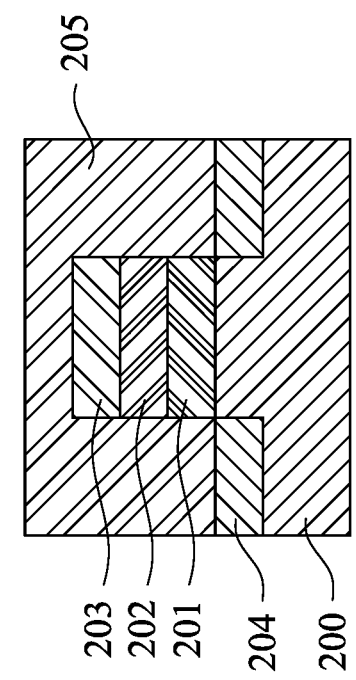

Reference is made to FIGS. 27A to 27C, in which FIG. 27A is a top view of one stage of manufacturing a semiconductor device, FIG. 27B is a cross-sectional view along line B-B' of FIG. 27A, and FIG. 27C is a cross-sectional view along line C-C' of FIG. 27A. The isolation material 206 is partially removed by using the dummy gate structure 205 as a mask. The isolation material 206 may be removed by suitable process, such as dry etching. Accordingly, the mask 203 is exposed after the isolation material 206 is removed.

Figure 28C:
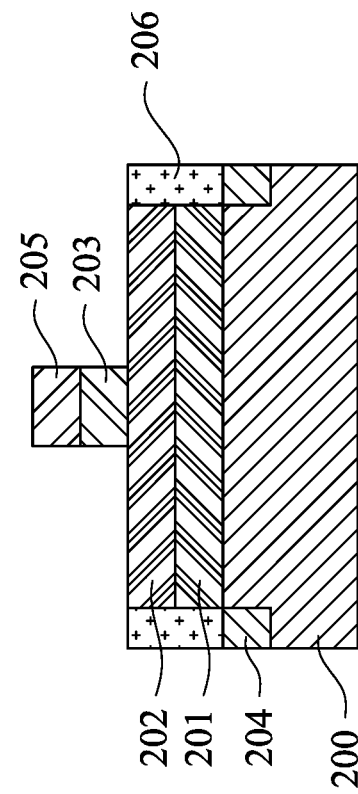
Figure 28A:
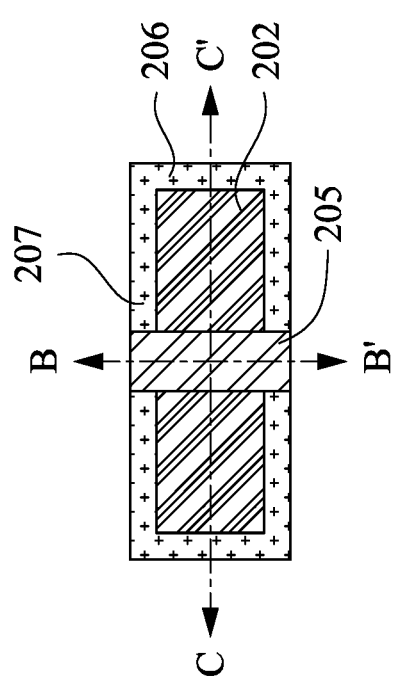
Figure 28B:
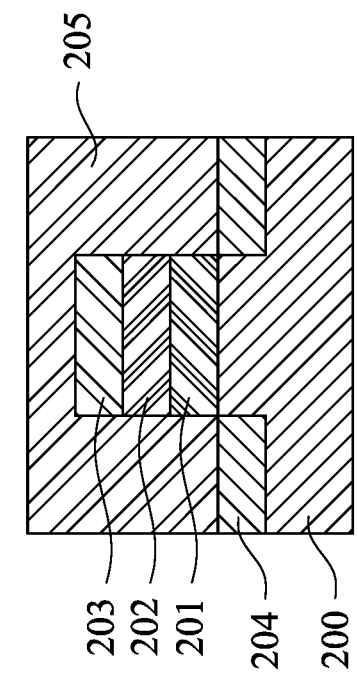

Reference is made to FIGS. 28A to 28C, in which FIG. 28A is a top view of one stage of manufacturing a semiconductor device, FIG. 28B is a cross-sectional view along line B-B' of FIG. 28A, and FIG. 28C is a cross-sectional view along line C-C' of FIG. 28A. The isolation material 206 and the mask 203 are partially removed by using the dummy gate structure 205 as a mask. The isolation material 206 and the mask 203 may be removed by suitable process, such as dry etching. Accordingly, the second semiconductor layer 202 is exposed after the mask 203 is removed.

Reference is made to FIGS. 29A to 29C, in which FIG. 29A is a top view of one stage of manufacturing a semiconductor device, FIG. 29B is a cross-sectional view along line B-B' of FIG. 29A, and FIG. 29C is a cross-sectional view along line C-C' of FIG. 29A. Plural gate spacers 207 are formed on opposite sidewalls of the dummy gate structure 205. The structure and material of the gate spacers 207 may be the same as or similar to the gate spacers 107 described in FIGS. 10A to 10C.

Figure 30C:
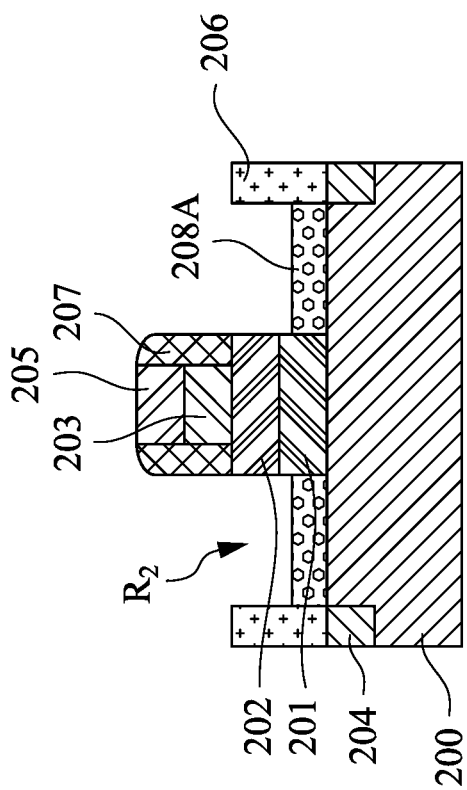
Figure 30A:
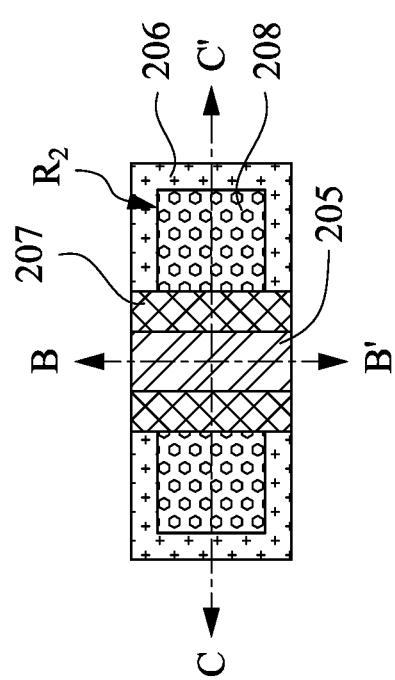
Figure 30B:
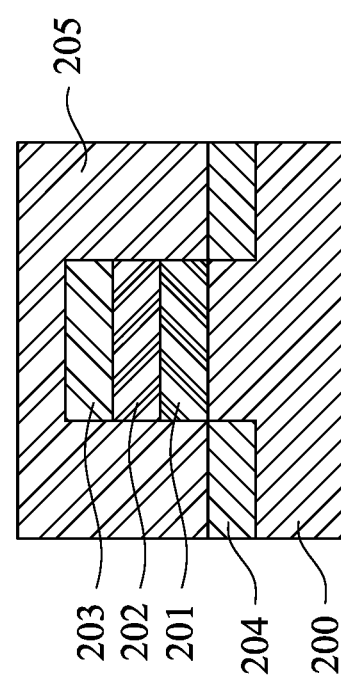

Reference is made to FIGS. 30A to 30C, in which FIG. 30A is a top view of one stage of manufacturing a semiconductor device, FIG. 30B is a cross-sectional view along line B-B' of FIG. 30A, and FIG. 30C is a cross-sectional view along line C-C' of FIG. 30A. The first semiconductor layer 201 and the second semiconductor layer 202 are patterned using the dummy gate structure 205 and the gate spacers 207 as a mask, and thus recesses $R_2$ are formed over the substrate 200 and in the isolation material 206. Then, plural source/drain structures 208A are formed in the recesses $R_2$, respectively. In some embodiments, the source/drain structures 208A are partially filled in the recesses $R_2$, and leaves top portions of the recesses $R_2$ unfilled. The structure and material of the source/drain structures 208A may be the same as or similar to the source/drain structures 108 described in FIGS. 11A to 11C.

Figure 31A:
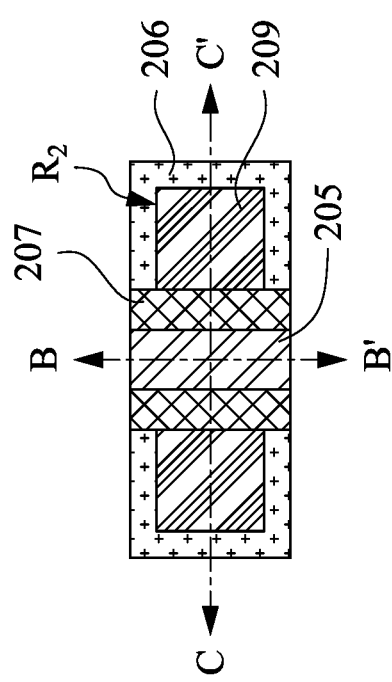
Figure 31B:
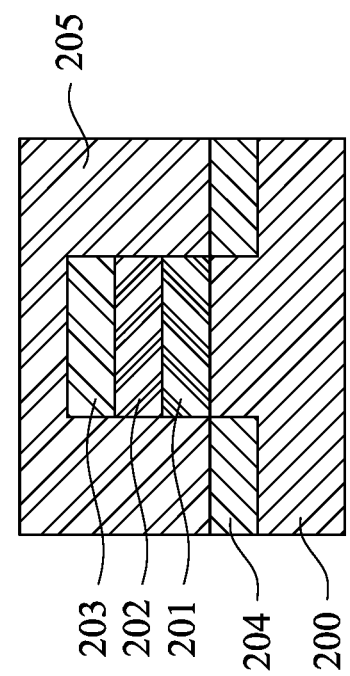
Figure 31C:
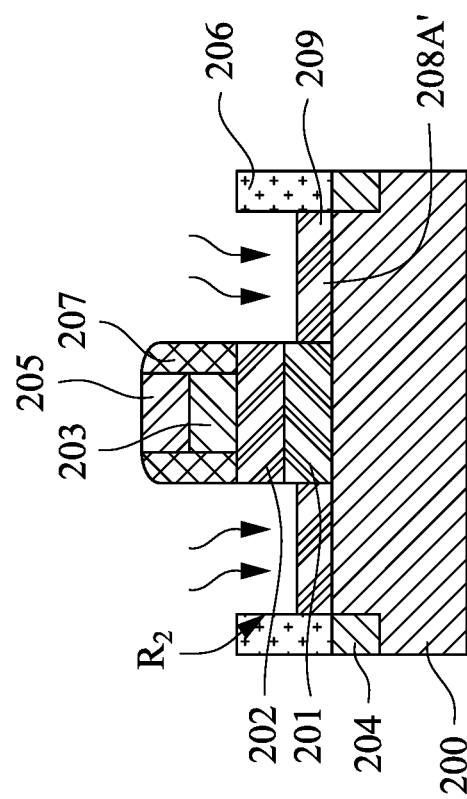

Reference is made to FIGS. 31A to 31C, in which FIG. 31A is a top view of one stage of manufacturing a semiconductor device, FIG. 31B is a cross-sectional view along line B-B' of FIG. 31A, and FIG. 31C is a cross-sectional view along line C-C' of FIG. 31A. A dopant drive-in process is performed to facilitate dopant diffusion into the source/drain structures 208A. Since the source/drain structures 208A are partially filled in the recesses $R_2$, the thickness of the source/drain structures 208A is relatively smaller than that of the source/drain structures 108 described in FIGS. 11A to 11C. As a result, in some embodiments, the entire regions of the source/drain structures 208A may be heavily doped because of short diffusion path. In the following descriptions, the doped source/drain structures 208A is labeled as 208A', and may be referred to as heavily doped source/drain structures 208A'. The dopant drive-in process is similar to that described in the FIGS. 12A to 12C, and thus details will not be repeated hereinafter.

It is worth noted that, in some embodiments, a dopant-containing layer (not shown) similar to that described in FIGS. 13A to 13C may also be formed on the heavily doped source/drain structures 208A' during the dopant drive-in process. Thus, an etching process may be performed to remove the dopant-containing layer after the dopant drive-in process to expose the heavily doped source/drain structures 208A'. In some other embodiments, the process duration may be tuned (e.g. short process duration), such that the dopant-containing layer may not be formed.

Figure 32C:
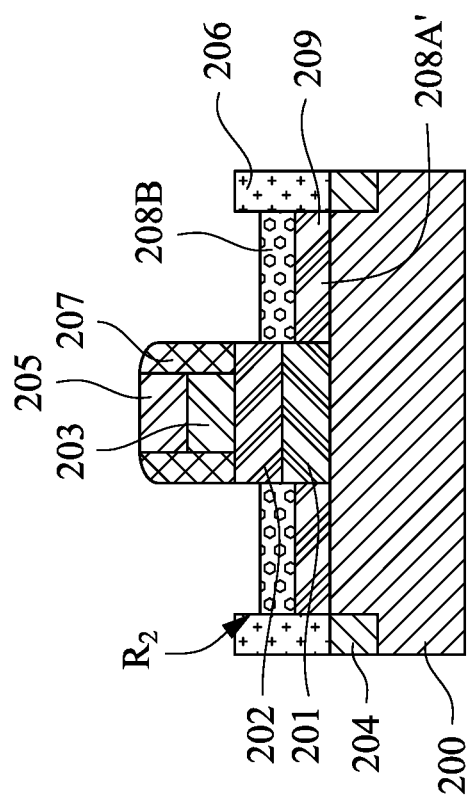
Figure 32A:
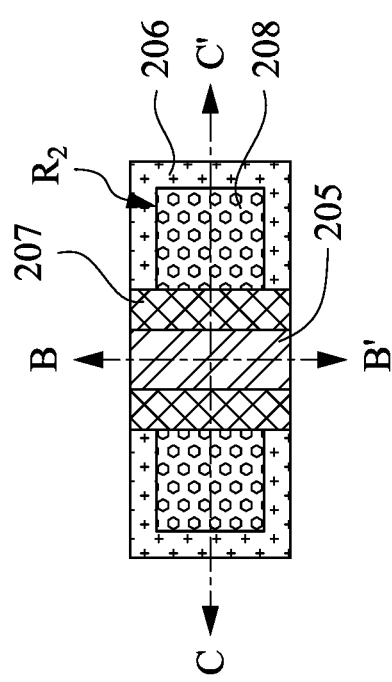
Figure 32B:
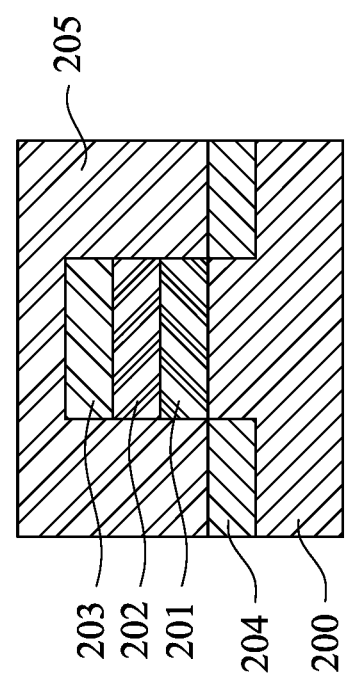

Reference is made to FIGS. 32A to 32C, in which FIG. 32A is a top view of one stage of manufacturing a semiconductor device, FIG. 32B is a cross-sectional view along line B-B' of FIG. 32A, and FIG. 32C is a cross-sectional view along line C-C' of FIG. 32A. Plural source/drain structures 208B are formed in the recesses $R_2$ and over the heavily doped source/drain structures 208A', respectively. Similarly, the source/drain structures 208B are partially filled in the recesses $R_2$, and leaves top portions of the recesses $R_2$ unfilled. The structure and material of the source/drain structures 208B may be the same as or similar to the source/drain structures 208A of FIGS. 30A to 30C.

Figure 33C:
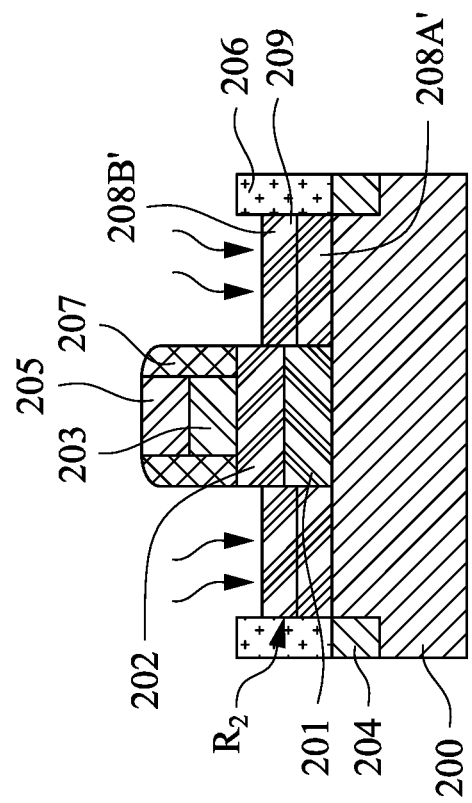
Figure 33A:
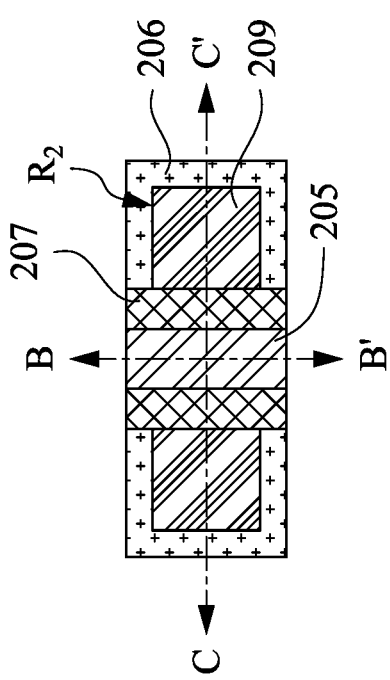
Figure 33B:
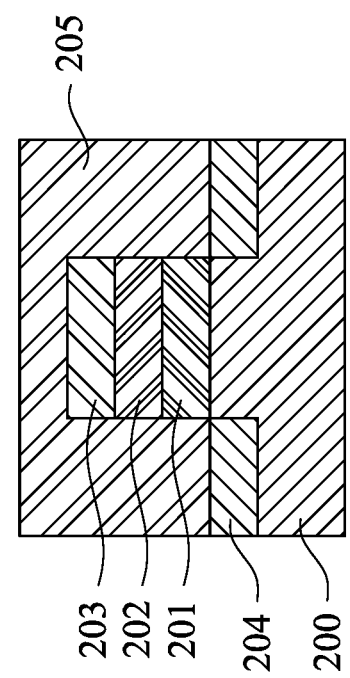

Reference is made to FIGS. 33A to 33C, in which FIG. 33A is a top view of one stage of manufacturing a semiconductor device, FIG. 33B is a cross-sectional view along line B-B' of FIG. 33A, and FIG. 33C is a cross-sectional view along line C-C' of FIG. 33A. A dopant drive-in process is performed to facilitate dopant diffusion into the source/drain structures 208B. As a result, in some embodiments, the entire regions of the source/drain structures 208B may be heavily doped. In the following descriptions, the doped source/drain structures 208B is labeled as 208B', and may be referred to as heavily doped source/drain structures 208B'. In some embodiments, the processes described in FIGS. 32A to 33C is the same as those described in FIGS. 30A to 31C. Thus, state another way, the processes described in FIGS. 32A to 33C may be referred to as repeating the processes in FIGS. 30A to 31C.

Figure 34A:
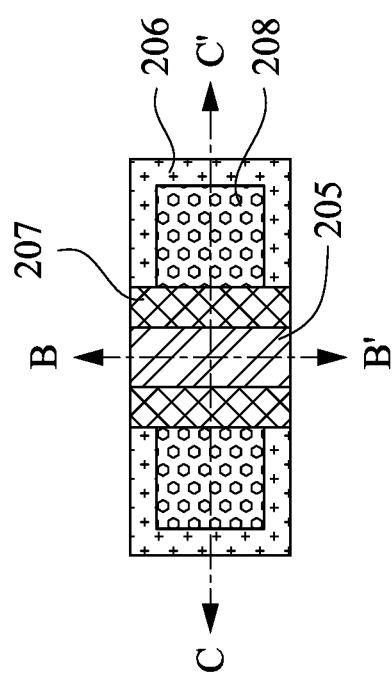
Figure 34B:
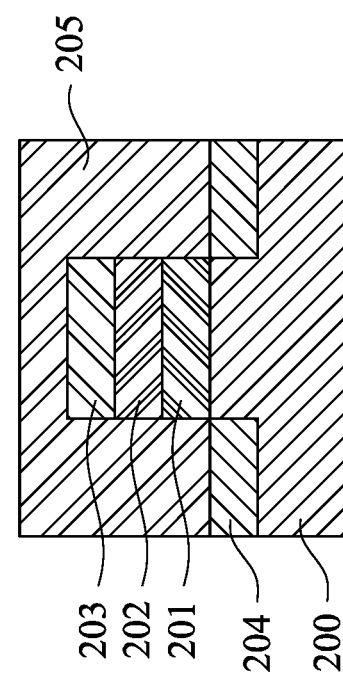
Figure 34C:
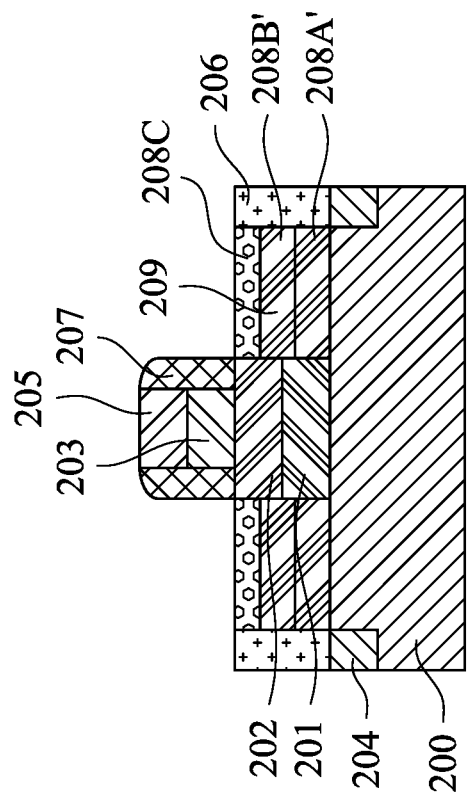
Figure 35A:
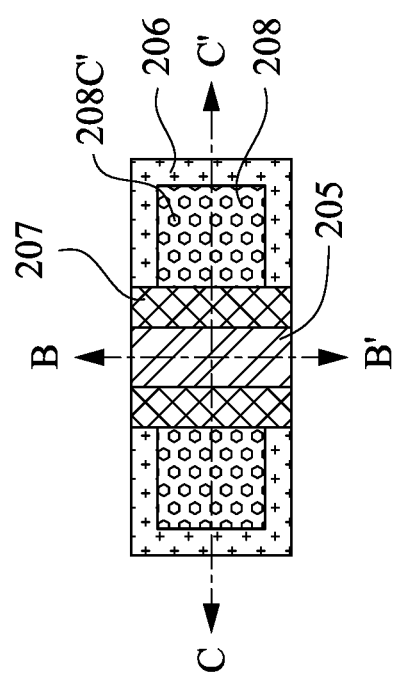
Figure 35B:
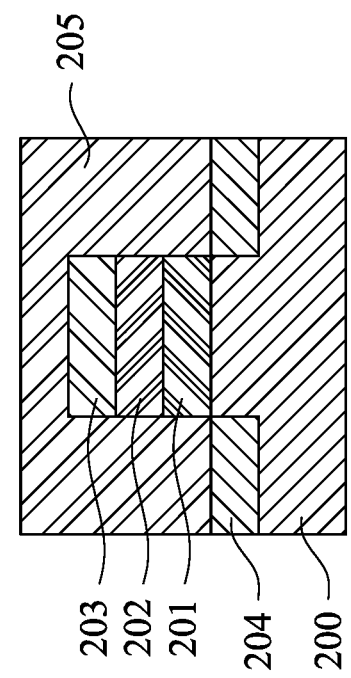
Figure 35C:
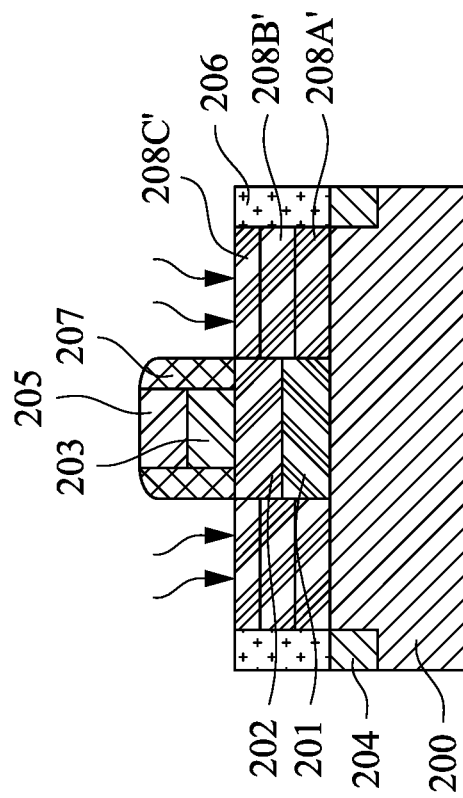

Reference is made to FIGS. 34A to 34C and FIGS. 35A to 35C, in which FIGS. 34A and 35A are top views of stages of manufacturing a semiconductor device, FIGS. 34B and 35B are cross-sectional views along line B-B' of FIGS. 34A and 35A, and FIGS. 34C and 35C are cross-sectional views along line C-C' of FIGS. 34A and 35A. Similar to those described above, plural source/drain structures 208C are formed in the recesses $R_2$ and over the heavily doped source/drain structures 208B', as shown in FIGS. 34A to 34C. Then, a dopant drive-in process is performed to dope the source/drain structures 208C. In the following descriptions, the doped source/drain structures 208C is labeled as 208C', and may be referred to as heavily doped source/drain structures 208C'. In some embodiments, the processes described in FIGS. 34A to 35C is the same as those described in FIGS. 30A to 31C. Thus, state another way, the processes described in FIGS. 34A to 35C may be referred to as repeating the processes in FIGS. 30A to 31C.

Figure 36C:
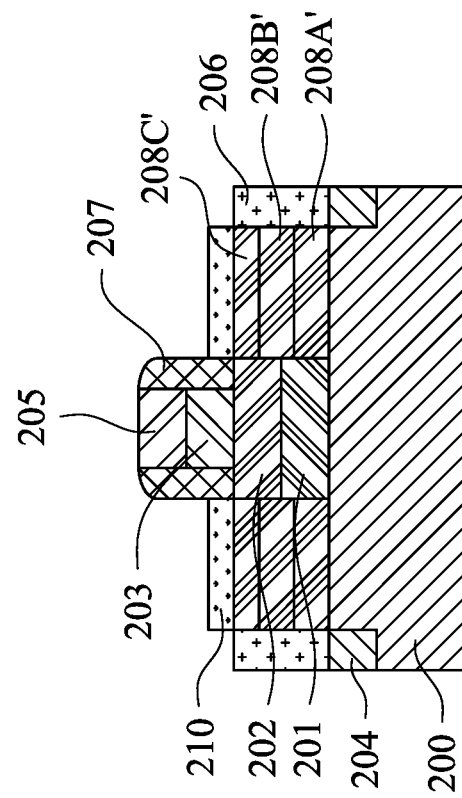
Figure 36A:
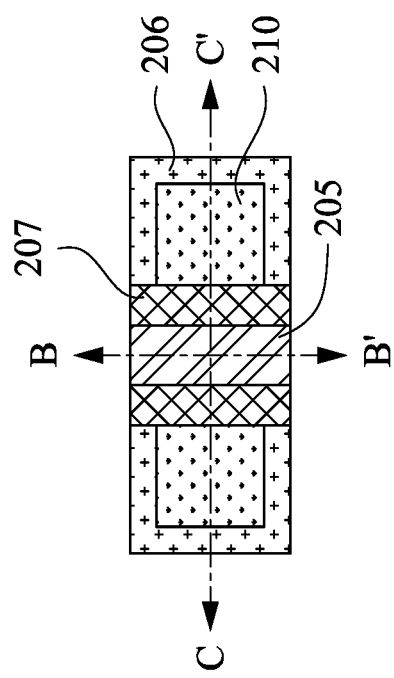
Figure 36B:
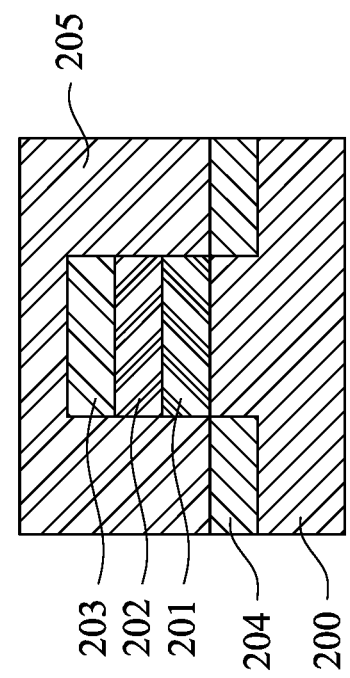

Reference is made to FIGS. 36A to 36C, in which FIG. 36A is a top view of one stage of manufacturing a semiconductor device, FIG. 36B is a cross-sectional view along line B-B' of FIG. 36A, and FIG. 36C is a cross-sectional view along line C-C' of FIG. 36A. After the dopant drive-in process proceeds a period of time, dopant-containing layers 210 may be formed on the exposed surfaces of the heavily doped source/drain structures 208C', respectively. In other words, the dopant-containing layers 210 are formed on and in contact with the heavily doped source/drain structures 208C'. The structure and material of the dopant-containing layers 210 may be the same as or similar to the dopant-containing layers 110 of FIGS. 13A to 13C.

Figure 37A:
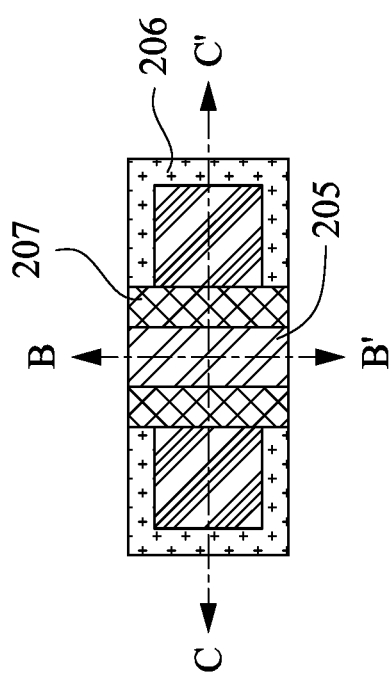
Figure 37B:
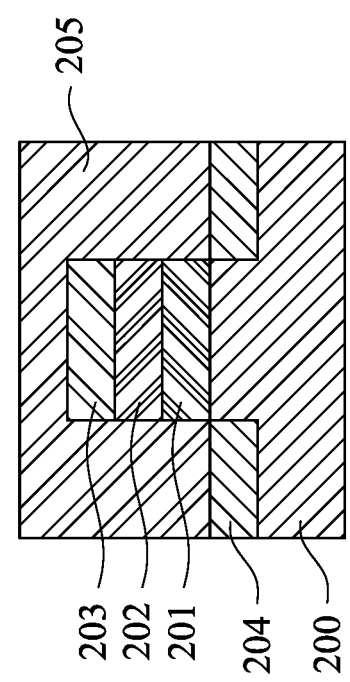
Figure 37C:
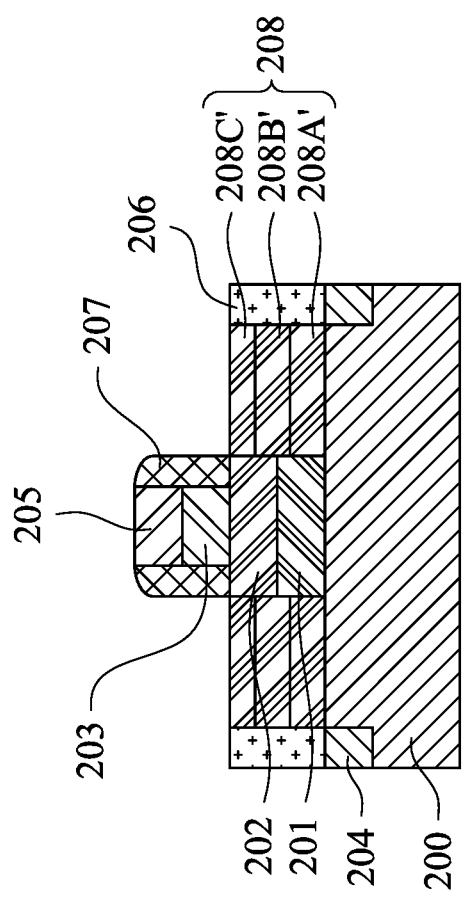

Reference is made to FIGS. 37A to 37C, in which FIG. 37A is a top view of one stage of manufacturing a semiconductor device, FIG. 37B is a cross-sectional view along line B-B' of FIG. 37A, and FIG. 37C is a cross-sectional view along line C-C' of FIG. 37A. The dopant-containing layers 210 (referring to FIGS. 36A to 36C) are removed by suitable process, such as etching. Accordingly, the top surfaces of the heavily doped source/drain structures 208C' are exposed. The etching process may be the same or similar to that described in FIGS. 14A to 14C, and will not be repeated hereinafter.

The remained heavily doped source/drain structures 208A', 208B', and 208C' may be collectively referred to as source/drain structures 208. Since the source/drain structures 208 are gradually formed by repeating cycles of forming the source/strain structure and performing the dopant drive-in process, the whole region of the source/drain structures 208 may be heavily doped. State differently, the heavily doped regions substantially cover the whole regions of the source/drain structures 208. It is worth noted that the repeated times of cycles of forming the source/strain structure and performing the dopant drive-in process (e.g. three times described in FIGS. 30A to 36C) is used to explain, and the present disclosure is not limited thereto. In some other embodiments, more or less repeated times may also be applied according to design.

Figure 38A:
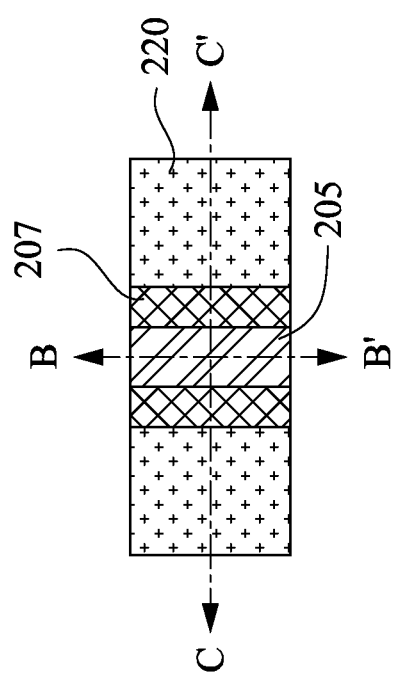
Figure 38B:
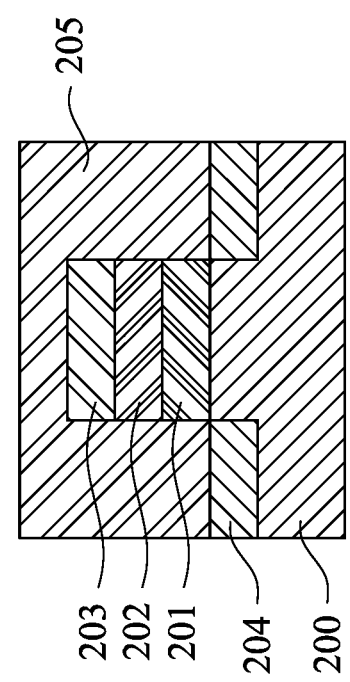
Figure 38C:
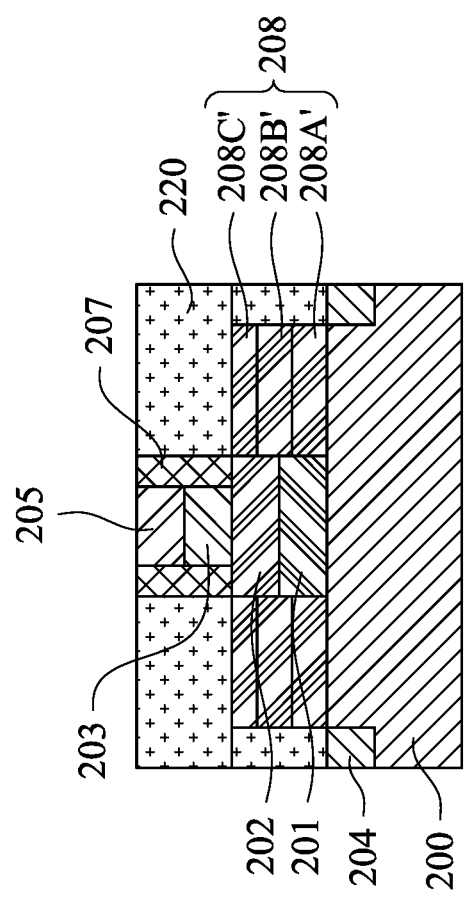

Reference is made to FIGS. 38A to 38C, in which FIG. 38A is a top view of one stage of manufacturing a semiconductor device, FIG. 38B is a cross-sectional view along line B-B' of FIG. 38A, and FIG. 38C is a cross-sectional view along line C-C' of FIG. 38A. An isolation material 220 is formed over the substrate 200. Further, a planarization process, such as chemical mechanical polishing (CVD), may be performed to the isolation material 220 until the dummy gate structure 205 is exposed. The structure and material of the isolation material 220 may be the same as or similar to the isolation material 120 of FIGS. 15A to 15C.

Figure 39A:
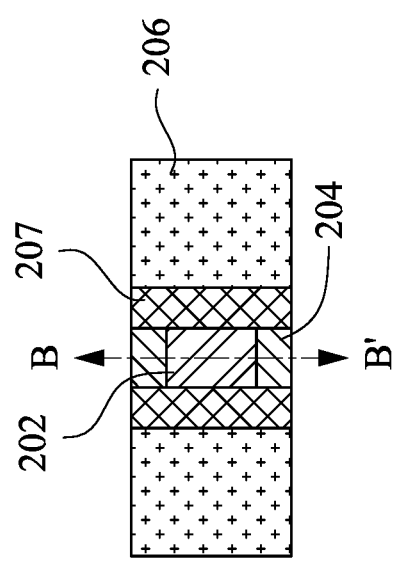
Figure 39B:
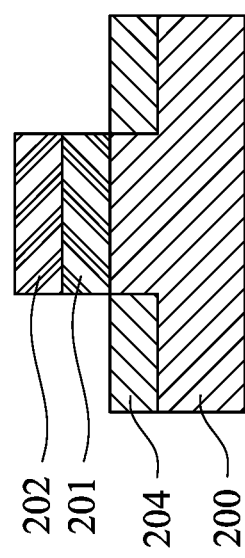

Reference is made to FIGS. 39A and 39B, in which FIG. 39A is a top view of one stage of manufacturing a semiconductor device, and FIG. 39B is a cross-sectional view along line B-B' of FIG. 39A. The dummy gate structure 205 and the mask 203 are removed by suitable process, such as etching. The etching process may be similar to that described in FIGS. 16A and 16B.

Figure 40A:
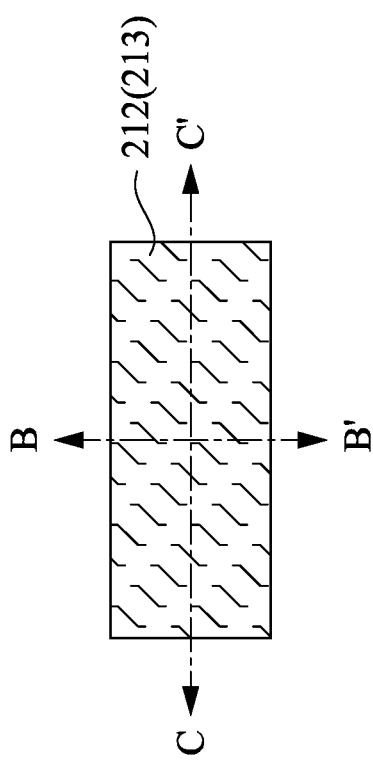
Figure 40B:
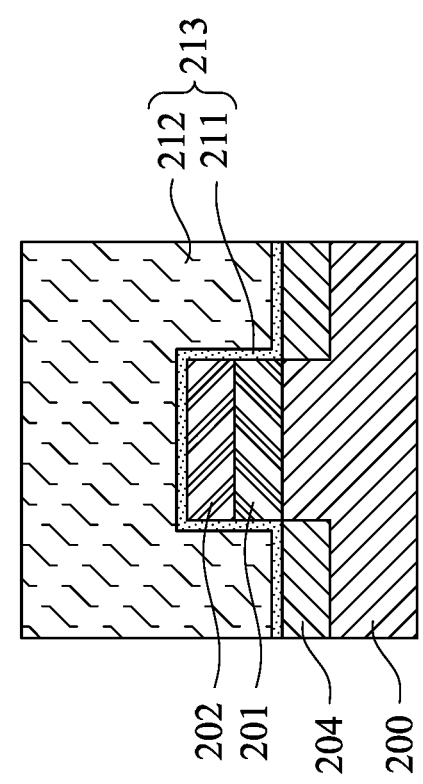
Figure 40C:
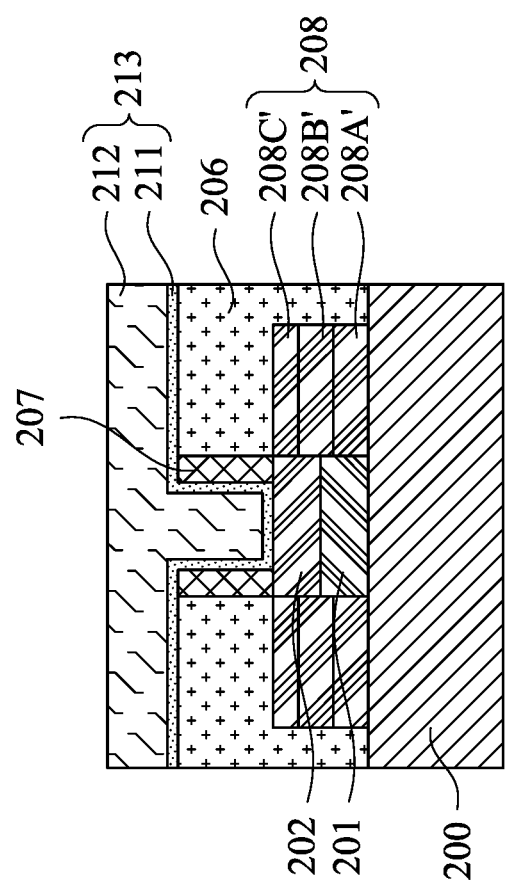

Reference is made to FIGS. 40A to 40C, in which FIG. 40A is a top view of one stage of manufacturing a semiconductor device, FIG. 40B is a cross-sectional view along line B-B' of FIG. 40A, and FIG. 40C is a cross-sectional view along line C-C' of FIG. 40A. A gate stack 213 is formed crossing and in contact with the first semiconductor layer 201 and the second semiconductor layer 202. The gate stack 213 includes a gate dielectric 211 conformally formed on exposed surfaces of the first semiconductor layer 201 and the second semiconductor layer 202, and a gate metal 212 formed over the gate dielectric 211. The structure and material of the gate stack 213 may be the same as or similar to the gate stack 113 of FIGS. 17A to 17C.

Figure 41A:
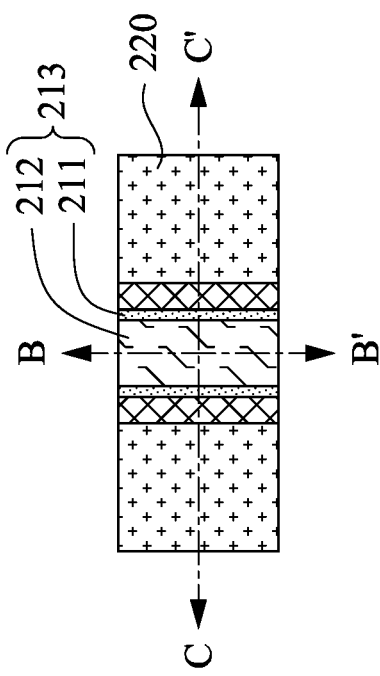
Figure 41B:
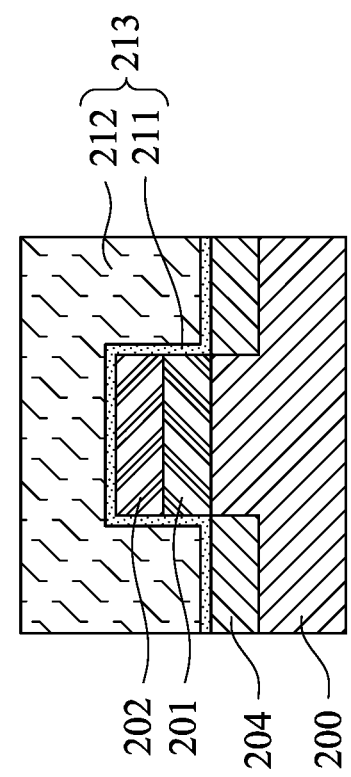
Figure 41C:
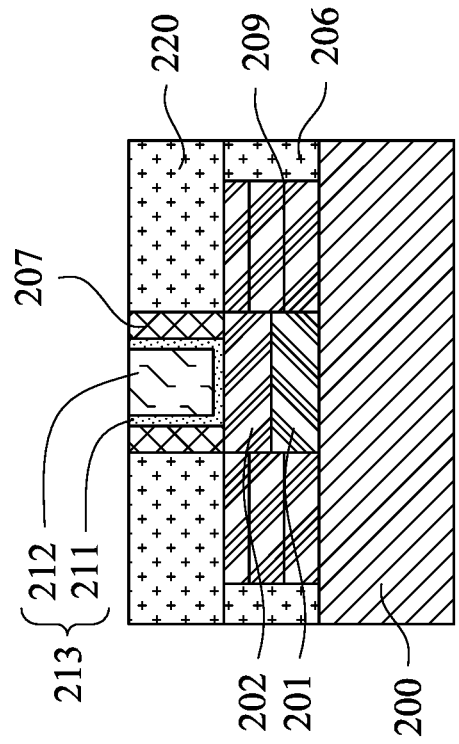

Reference is made to FIGS. 41A to 41C, in which FIG. 41A is a top view of one stage of manufacturing a semiconductor device, FIG. 41B is a cross-sectional view along line B-B' of FIG. 41A, and FIG. 41C is a cross-sectional view along line C-C' of FIG. 41A. A planarization process, such as CMP, is performed to the gate stack 213 until the isolation material 220 is exposed.

FIGS. 42A to 42D are dopant concentration profiles of the source/drain region of the semiconductor device of FIG. 41C in accordance with some embodiments. In these figures, the horizontal axis represents the dopant concentration of the source/drain region of the semiconductor device of FIG. 41C (e.g. the source/drain structures 208A', 208B' and 208C'), and the vertical axis represents the depth of the source/drain region of the semiconductor device of FIG. 41C.

Figure 42A:
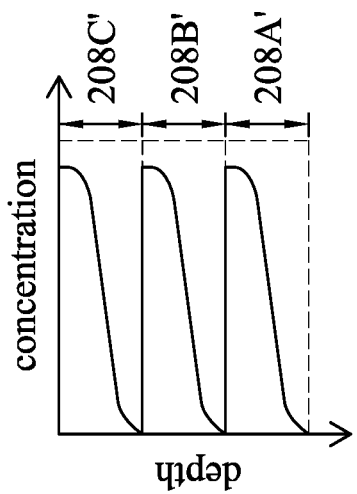
FIGS. 42A to 42D are dopant concentration profiles of a source/drain region of a semiconductor device in accordance with some embodiments.

Reference is made to FIG. 42A. The dopant concentrations correspond to the source/drain structures 208A', 208B' and 208C respectively decrease as the depth increases, since the dopants diffuse downwardly from the top of the source/drain region. In some embodiments, the dopant concentration distribution of the dopant concentrations correspond to the source/drain structures 208A', 208B' and 208C' is close to an error function (erf). In some embodiments, the dopant concentration distributions of the source/drain structures 208A', 208B' and 208C' are substantially the same. That is, the peak dopant concentrations of source/drain structures 208A', 208B' and 208C' are substantially the same.

Figure 42B:
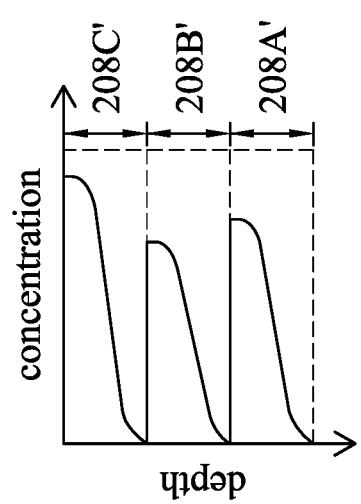

Reference is made to FIG. 42B. FIG. 42B is different from FIG. 42A, in that the peak dopant concentrations of the corresponding source/drain structures 208A', 208B' and 208C' are different. This may be achieved by controlling the process parameters in FIGS. 30A to 35C. In some embodiments, the dopant concentration distributions of the source/drain structures 208A', 208B' and 208C' are close to an error function (erf).

Figure 42C:
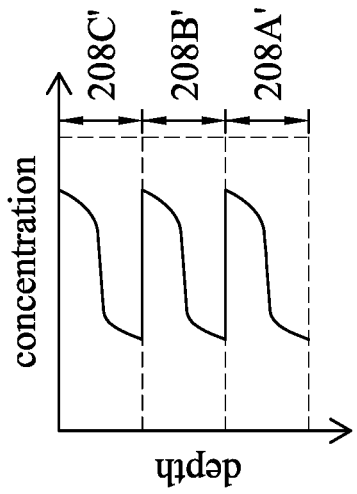

Reference is made to FIG. 42C. FIG. 4C is different from FIG. 42A, in that the source/drain structures 208A', 208B' and 208C' are in-situ doped. Thus, the dopant concentrations of the source/drain structures 208A', 208B' and 208C' have initial values that are larger than 0. In some embodiments, the dopant concentration distributions of source/drain structures 208A', 208B' and 208C are close to an error function (erf).

Figure 42D:
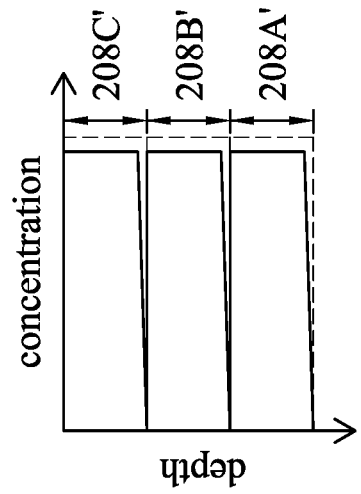

Reference is made to FIG. 42D. The dopant concentrations of the source/drain structures 208A', 208B' and 208C are substantially uniform and have substantially uniform peak dopant concentrations. This is because the dopants in the source/drain structures 208A', 208B' and 208C' may be saturated during the dopant drive-in process in FIGS. 31A-31C, 33A-33C, and 35A-35C.

According to the aforementioned embodiments, source/drain structures are formed over a substrate. Then, a dopant drive-in process is performed by exposing the source/drain structures to a dopant-containing gas to diffuse a dopant into regions of the source/drain structures. The process is performed at a lower temperature, and thus the process has lower thermal budget. As such, the crystallization of the source/drain structures may not be destroyed, because the dopant is driven into the source/drain structures by diffusion mechanism, not a high power implantation process that may destroy the crystallization of the source/drain structures. As a result, the entire source/drain structures may be single crystalline. Stated another way, the entire source/drain structures may include uniform crystallization type. Further, the source/drain structures may include both higher Sn concentration and boron concentration, because the process is performed with a low thermal budget such that the boron atoms may not occupy the Sn atoms. In contrast, if the source/drain structures are subject to a higher power process, such as an dopant implantation, the boron atoms tend to occupy substitutional Sn sites rather than Ge sites to obtain lower formation energy, such that the Sn concentration of the source/drain structures may decrease accordingly. In this way, the source/drain structures with higher Sn concentration may act as a stressor to provide more compressive strain to a gate channel, and the higher boron concentration may also reduce the contact resistance and increase carrier density. Accordingly, the device performance may be improved.

In some embodiments of the present disclosure, a method includes forming a fin structure over a substrate; forming a source/drain structure adjoining the fin structure, in which the source/drain structure includes tin; and exposing the source/drain structure to a boron-containing gas to diffuse boron into the source/drain structure to form a doped region in the source/drain structure.

According to some embodiments, exposing the source/drain structure to the boron-containing gas is performed such that a boron-containing layer is formed over a top surface of the source/drain structure.

According to some embodiments, the method further includes removing the boron-containing layer from the top surface of the source/drain structure.

According to some embodiments, the method further includes repeating forming the source/drain structure and exposing the source/drain structure to the boron-containing gas.

According to some embodiments, the source/drain structure includes germanium.

According to some embodiments, forming the fin structure includes forming a first semiconductor layer over the substrate; forming a second semiconductor layer over the first semiconductor layer; and patterning the first semiconductor layer, the second semiconductor layer, and the substrate to form a fin structure.

According to some embodiments, a lattice constant of the first semiconductor layer is between a lattice constant of the substrate and a lattice constant of the second semiconductor layer.

According to some embodiments, the method further includes partially removing the fin structure to form a recess in the fin structure, in which forming the source/drain structure is performed such that the source/drain structure is partially filled in the recess.

According to some embodiments, the boron-containing gas includes $B_2H_6$.

According to some embodiments, the method further includes exposing the source/drain structure to the boron-containing gas is performed such that a boron-containing layer is not formed over a top surface of the source/drain structure.

In some embodiments of the present disclosure, a method includes forming a fin structure over a substrate; partially removing the fin structure to form a recess in the fin structure; forming a source/drain structure in the recess, in which the source/drain structure includes tin; doping the source/drain structure with boron to form a doped region in the source/drain structure at a temperature lower than a recrystallization temperature of the source/drain structure; and forming an inter-layer dielectric (ILD) layer over the source/drain structure.

According to some embodiments, doping the source/drain structure is performed such that a boron-containing layer is formed over a top surface of the source/drain structure, and a boron concentration of the boron-containing layer is higher than a boron concentration of the doped region.

According to some embodiments, the method further includes etching the boron-containing layer.

According to some embodiments, the method further includes repeating forming the source/drain structure and doping the source/drain structure until the recess is filled.

According to some embodiments, partially removing the fin structure includes forming a dummy gate structure over the fin structure; forming a pair of gate spacers on opposite sidewalls of the dummy gate structure; and patterning the fin structure by using the dummy gate structure and the gate spacers as a first mask.

According to some embodiments, forming the fin structure includes forming a first semiconductor layer over the substrate; forming a second semiconductor layer over the first semiconductor layer, in which the second semiconductor layer contains Ge, and the source/drain structure contains GeSn; and forming a patterned mask over the second semiconductor layer; and patterning the second semiconductor layer and the first semiconductor layer through the patterned mask.

In some embodiments of the present disclosure, a semiconductor device includes a fin structure over a substrate, in which the fin structure comprises a first semiconductor layer and a second semiconductor layer over the first semiconductor layer, a gate stack over the substrate and crossing the fin structure, and a source/drain structure adjoining the fin structure. The source/drain structure includes a doped region, and a boron concentration of the doped region is greater than about $1\times10^{20}$ at/cm$^3$, and a tin concentration of the doped region is greater than about 8 at %.

According to some embodiments, the entire doped region is single crystalline.

According to some embodiments, the boron concentration of the doped region decreases from a top of the doped region to a bottom of the doped region.

According to some embodiments, the second semiconductor layer is made of Ge, and the first semiconductor layer is made of SiGe.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin structure over a substrate;
    forming a source/drain structure adjoining the fin structure, wherein the source/drain structure comprises tin; and
    exposing the source/drain structure to a boron-containing gas to diffuse boron into the source/drain structure to form a doped region in the source/drain structure, wherein exposing the source/drain structure to the boron-containing gas is performed such that a boron-containing layer free of a source/drain structure material is formed over a top surface of the source/drain structure, and a total thickness of the source/drain structure and the boron-containing layer is greater than a thickness of the source/drain structure.

2. The method of claim 1, further comprising removing the boron-containing layer from the top surface of the source/drain structure.

3. The method of claim 1, further comprising repeating forming the source/drain structure and exposing the source/drain structure to the boron-containing gas.

4. The method of claim 1, wherein the source/drain structure comprises germanium.

5. The method of claim 1, wherein forming the fin structure comprises:
    forming a first semiconductor layer over the substrate;
    forming a second semiconductor layer over the first semiconductor layer; and
    patterning the first semiconductor layer, the second semiconductor layer, and the substrate to form the fin structure.

6. The method of claim 5, wherein a lattice constant of the first semiconductor layer is between a lattice constant of the substrate and a lattice constant of the second semiconductor layer.

7. The method of claim 1, further comprising partially removing the fin structure to form a recess in the fin structure, wherein forming the source/drain structure is performed such that the source/drain structure is partially filled in the recess.

8. The method of claim 1, wherein the boron-containing gas comprises $B_2H_6$.

9. The method of claim 1, wherein the boron concentration of the boron-containing layer is higher than a boron concentration of the doped region.

10. A method, comprising:
    forming a fin structure over a substrate;
    forming a dummy gate structure over the fin structure;
    after forming the dummy gate structure, partially removing the fin structure to form a recess in the fin structure;

forming a source/drain structure in the recess, wherein the source/drain structure comprises tin;

doping the source/drain structure with boron to form a doped region in the source/drain structure at a temperature lower than a recrystallization temperature of the source/drain structure;

repeating forming the source/drain structure and doping the source/drain structure until the recess is filled, wherein repeating forming the source/drain structure and doping the source/drain structure is performed such that each of the source/drain structures is in contact with the fin structure;

forming an inter-layer dielectric (ILD) layer over the source/drain structure; and replacing the dummy gate structure with a metal gate structure.

11. The method of claim 10, wherein doping the source/drain structure is performed such that a boron-containing layer is formed over a top surface of the source/drain structure, and a boron concentration of the boron-containing layer is higher than a boron concentration of the doped region.

12. The method of claim 11, further comprising etching the boron-containing layer.

13. The method of claim 10, wherein partially removing the fin structure comprises:

forming a pair of gate spacers on opposite sidewalls of the dummy gate structure; and patterning the fin structure by using the dummy gate structure and the gate spacers as a first mask.

14. The method of claim 10, wherein forming the fin structure comprises:

forming a first semiconductor layer over the substrate;

forming a second semiconductor layer over the first semiconductor layer, wherein the second semiconductor layer contains Ge, and the source/drain structure contains GeSn;

forming a patterned mask over the second semiconductor layer; and patterning the second semiconductor layer and the first semiconductor layer through the patterned mask.

15. A semiconductor device, comprising:

a fin structure over a substrate, wherein the fin structure comprises a first semiconductor layer and a second semiconductor layer over the first semiconductor layer;

a gate stack over the substrate and crossing the fin structure; and a source/drain structure adjoining the fin structure, wherein the source/drain structure comprises a doped region, a boron concentration of the doped region is greater than about $1 \times 10^{20}$ at/cm3, and a tin concentration of the doped region is greater than about 8 at %, and wherein the source/drain structure comprises a first region, a second region over the first region, and a third region over the second region, a dopant concentration of each of the first, second, and third regions decrease as a distance from each of the first, second, and third regions to the substrate decreases, and a highest dopant concentration of each of the first, second, and third regions is higher than a lowest dopant concentration of each of the first, second, and third regions.

16. The semiconductor device of claim 15, wherein the entire doped region is single crystalline.

17. The semiconductor device of claim 15, wherein the second semiconductor layer is made of Ge, and the first semiconductor layer is made of SiGe.

18. The semiconductor device of claim 15, wherein the source/drain structure is in contact with the fin structure.

19. The semiconductor device of claim 15, wherein the second region of the source/drain structure passes an interface between the first semiconductor layer and the second semiconductor layer.

20. The semiconductor device of claim 15, further comprising an isolation material over the substrate and in contact with a top surface of the substrate and a sidewall of the source/drain structure.

\* \* \* \* \*